(12) United States Patent
Yang et al.

(10) Patent No.: US 12,457,709 B2
(45) Date of Patent: Oct. 28, 2025

(54) THERMAL TRANSFER DEVICE FOR ELECTRONIC PROCESSORS

(71) Applicant: NIO Technology (Anhui) Co., Ltd., Hefei (CN)

(72) Inventors: Tseng-Mau Yang, South Lake Tahoe, CA (US); Bradley J. Angier, Santa Cruz, CA (US); Waylon Y. Chen, San Jose, CA (US); Paul Alan Zahorsky, Santa Cruz, CA (US); Karl Yngve Johnson, Felton, CA (US)

(73) Assignee: NIO TECHNOLOGY (ANHUI) CO., LTD., Hefei (CN)

( * ) Notice: Subject to any disclaimer, the term of this patent is extended or adjusted under 35 U.S.C. 154(b) by 163 days.

(21) Appl. No.: 18/126,822

(22) Filed: Mar. 27, 2023

(65) Prior Publication Data
US 2023/0309264 A1    Sep. 28, 2023

Related U.S. Application Data

(60) Provisional application No. 63/323,922, filed on Mar. 25, 2022.

(51) Int. Cl.
H05K 7/20    (2006.01)

(52) U.S. Cl.
CPC ..... *H05K 7/20327* (2013.01); *H05K 7/20318* (2013.01); *H05K 7/20336* (2013.01); *H05K 7/20472* (2013.01)

(58) Field of Classification Search
CPC ........... H05K 7/20327; H05K 7/20336; H05K 7/20472; H05K 7/20454; H05K 7/2049; G06F 1/20
See application file for complete search history.

(56) References Cited

U.S. PATENT DOCUMENTS

| | | |
|---|---|---|
| 7,595,988 B2 | 9/2009 | Wilson et al. |
| 10,561,039 B2 | 2/2020 | Hannig |

(Continued)

FOREIGN PATENT DOCUMENTS

| | | |
|---|---|---|
| CN | 112004379 | 11/2020 |
| CN | 217064419 U | 7/2022 |

(Continued)

OTHER PUBLICATIONS

U.S. Appl. No. 18/232,982, Yang et al.

(Continued)

*Primary Examiner* — Jayprakash N Gandhi
*Assistant Examiner* — Jeffrey Francis Stoll
(74) *Attorney, Agent, or Firm* — Sheridan Ross P.C.

(57) ABSTRACT

An assembly includes a condenser plate, a plurality of pads and one or more heat-pipes. The condenser plate includes a plurality of apertures. Each of the plurality of apertures overlaps a location of a corresponding one of a plurality of integrated circuits. Each of the plurality of pads is disposed within each of the plurality of apertures and is configured to move in a vertical direction. The one or more heat-pipes are attached to the condenser plate and the plurality of pads and are configured to move in the vertical direction. Each of the plurality of pads is configured to be in thermal connection with the corresponding one of the plurality of integrated circuits by a movement of the one or more heat-pipes in the vertical direction to transfer to the condenser plate, thermal energy received by each of the plurality of pads from the plurality of integrated circuits.

15 Claims, 11 Drawing Sheets

(56) References Cited

U.S. PATENT DOCUMENTS

| | | | |
|---|---|---|---|
| 10,709,026 B2 | 7/2020 | Kim et al. | |
| 2005/0068741 A1 | 3/2005 | Bailey et al. | |
| 2008/0074839 A1* | 3/2008 | Tamaki | H05K 5/0256 |
| | | | 361/679.46 |
| 2008/0266808 A1* | 10/2008 | Aberg | H01L 23/4338 |
| | | | 361/709 |
| 2009/0213541 A1 | 8/2009 | Butterbaugh et al. | |
| 2011/0304979 A1* | 12/2011 | Peterson | H01L 23/473 |
| | | | 361/702 |
| 2012/0244742 A1* | 9/2012 | Wertz | H01L 23/427 |
| | | | 439/485 |
| 2013/0032324 A1 | 2/2013 | Aldridge et al. | |
| 2015/0116940 A1* | 4/2015 | Kim | H05K 1/0203 |
| | | | 29/592.1 |
| 2017/0150645 A1* | 5/2017 | Huang | H05K 5/0026 |
| 2020/0217599 A1* | 7/2020 | Narasimhan | F28D 15/02 |
| 2020/0229318 A1* | 7/2020 | Grau | H01L 23/4006 |
| 2021/0349507 A1 | 11/2021 | Cao et al. | |

FOREIGN PATENT DOCUMENTS

| | | |
|---|---|---|
| KR | 2011-0088684 | 8/2011 |
| WO | WO 2006/028643 | 3/2006 |

OTHER PUBLICATIONS

International Search Report and Written Opinion for International (PCT) Patent Application No. PCT/IB2023/000482, dated Nov. 15, 2023 14 pages.

* cited by examiner

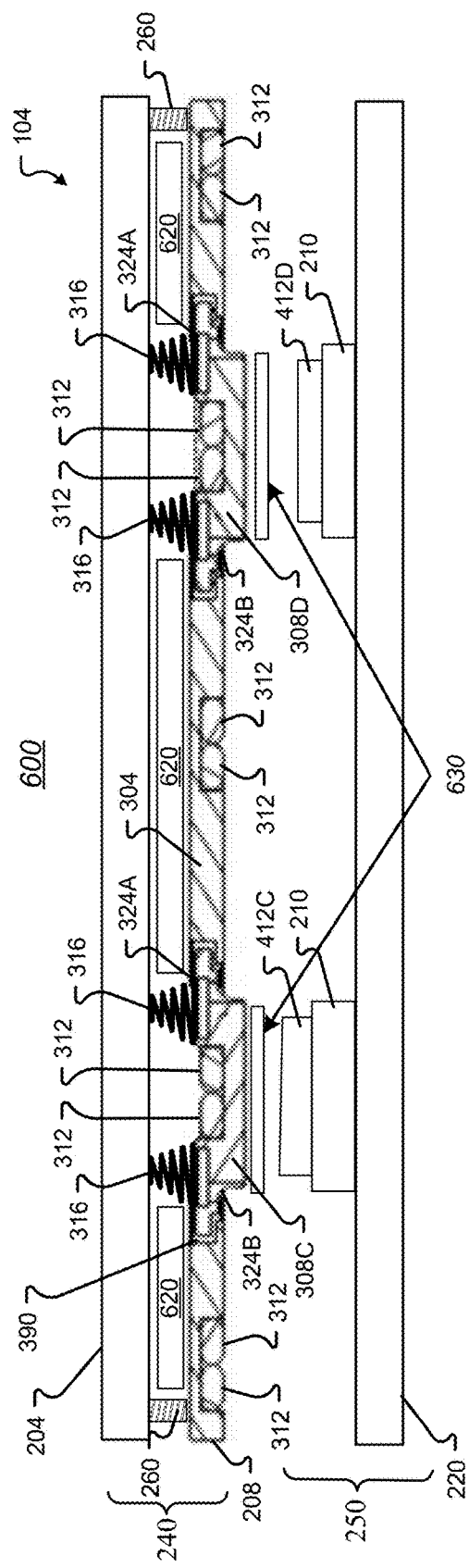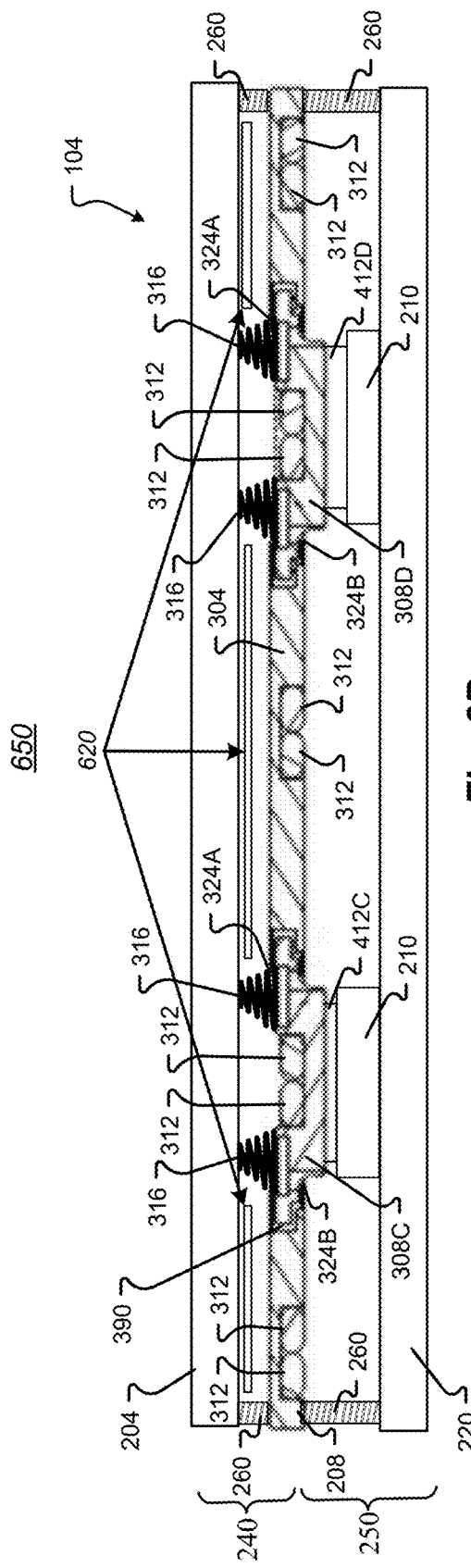

THERMAL TRANSFER DEVICE FOR ELECTRONIC PROCESSORS

CROSS-REFERENCE TO RELATED APPLICATIONS

The present application claims the benefit of and priority, under 35 U.S.C. § 119(e), to U.S. Provisional Application Ser. No. 63/323,922, filed on Mar. 25, 2022, entitled "SPRING-LOADED THERMAL TRANSFER DEVICE FOR MULTIPLE HIGH-POWER-DENSITY ELECTRONIC PROCESSORS," the entire disclosure of which is hereby incorporated herein by reference, in its entirety, for all that it teaches and for all purposes.

FIELD OF THE DISCLOSURE

The present disclosure is generally directed to electronic packaging, in particular, towards spring-loaded thermal transfer devices for electronic packages and processors.

BACKGROUND

Most electronic devices generate heat while in use. This heat is typically generated by the flow of electric current through one or more resistive elements and/or components in the electronic device. When the heat generated by these elements and/or components is not efficiently removed, the temperatures of an electronic device can exceed a normal operating range. Operating electronics at temperatures outside of the normal operating range, even periodically, can cause premature failures and result in shorter component life spans.

The efficient thermal management of electronic components and devices generally requires one or more active and/or passive cooling systems/elements. For example, typical microprocessors may generate heat that can be removed or dissipated via an attached cooling system and/or some other heat sink or cooling element/system, such as a fan, directed cooled air, fluid cooling, etc. In this example, the heat generated may be routed to, and/or dissipated, into an environment immediately surrounding the microprocessors.

However, the options for removing heat from an electronic device within a sealed environment (e.g., hermetic package, pseudo-hermetic package, sealed enclosure, etc.) may be limited to those approaches employing costly, sizable, and/or complex cooling systems.

In addition, modern electronic component assemblies, such as printed circuit board assemblies, may include multiple heat generating components (e.g., microprocessors, chips, integrated circuits, system on chips (SOCs), etc.) and/or thermal interfaces on a printed circuit board (PCB), or other circuit substrate. Manufacturing these assemblies generally requires a physical attachment of electronic components via some form of soldering and/or adhesion. As the solder joints in an assembly set (e.g., from a fluid form to solid form) the dimensional tolerances between assemblies may differ significantly and/or stack up on a particular assembly. Dealing with these tolerance issues in a conventional manner generally involves time consuming assembly, costly manufacturing techniques, or an overly-stressed number of components on an assembly to ensure intimate contact with cooling surfaces in a package.

BRIEF SUMMARY

Example aspects of the present disclosure include:

An assembly for providing cooling to a plurality of integrated circuits comprises a condenser plate, a plurality of pads and one or more heat-pipes. The condenser plate includes a plurality of apertures. Each of the plurality of apertures overlaps a location of a corresponding one of a plurality of integrated circuits. Each of the plurality of pads is disposed within each of the plurality of apertures of the condenser plate and is configured to move in a vertical direction. The one or more heat-pipes are attached to the condenser plate and the plurality of pads and are configured to move in the vertical direction. Each of the plurality of pads is configured to be in thermal connection with the corresponding one of the plurality of integrated circuits by a movement of the one or more heat-pipes in the vertical direction to transfer to the condenser plate, thermal energy received by each of the plurality of pads from the plurality of integrated circuits.

Any of the aspects herein, further comprising a plurality of biasing members engaging each pad of the plurality of pads and an opposing surface of a heat removal component in thermal connection with the condenser plate, each of the plurality of biasing members being configured to apply a compressive force to a portion of a corresponding one of the plurality of pads and the opposing surface of the heat removal component in response to movement of the portion of the corresponding one of the plurality of pads.

Any of the aspects herein, wherein a first plurality of biasing members on a first pad collectively exerts a first compressive force on a corresponding first integrated circuit and a second plurality of biasing members on a second pad collectively exerts a second compressive force on a corresponding second integrated circuit different than the first compressive force.

Any of the aspects herein, wherein each of the plurality of apertures comprises a peripheral wall and a ledge extending interiorly of the peripheral wall, the peripheral wall and ledge being spaced from an adjacent surface of a pad in a corresponding aperture, wherein a lateral movement of each pad is constrained by the peripheral wall in the corresponding aperture, and wherein the downward movement of each pad is constrained by the ledge in the corresponding aperture.

Any of the aspects herein, wherein each of the plurality of pads directly engages the opposing surface of the heat removal component only through the plurality of biasing members engaging the corresponding pad.

Any of the aspects herein, wherein the plurality of biasing members comprises a plurality of compressive springs, the compressive springs having substantially equivalent spring constants.

Any of the aspects herein, wherein each of the plurality of biasing members is configured to cause the portion of the corresponding one of the plurality of pads to maintain a constant compressive force on the opposing surface of the corresponding one of the plurality of integrated circuits to maintain a substantially uniform rate of heat transfer between the opposing surfaces of the corresponding one of the plurality of pads and the corresponding one of the plurality of integrated circuits.

An assembly for providing cooling to a plurality of integrated circuits comprises a condenser plate and one or more heat-pipes. The condenser plate includes a plurality of apertures. Each of the plurality of apertures overlaps a location of a corresponding one of a plurality of integrated circuits. The one or more heat-pipes are attached to the condenser plate and provided over the plurality of apertures overlapping the location of the corresponding one of the plurality of integrated circuits. The one or more heat-pipes are configured to move in a vertical direction to transfer to the condenser plate, thermal energy from the plurality of integrated circuits.

Any of the aspects herein, further comprising a plurality of pads, wherein each of the plurality of pads is disposed within each of the plurality of apertures of the condenser plate and configured to move in the vertical direction, wherein the one or more heat-pipes are also attached to the plurality of pads, and wherein each of the plurality of pads is configured to be in thermal connection with the corresponding one of the plurality of integrated circuits by the movement of the one or more heat-pipes in the vertical direction.

Any of the aspects herein, further comprising a plurality of biasing members engaging each pad of the plurality of pads and an opposing surface of a heat removal component in thermal connection with the condenser plate, each of the plurality of biasing members being configured to apply a compressive force to a portion of a corresponding one of the plurality of pads and the opposing surface of the heat removal component in response to movement of the portion of the corresponding one of the plurality of pads.

Any of the aspects herein, wherein a first plurality of biasing members on a first pad collectively exerts a first compressive force on a corresponding first integrated circuit and a second plurality of biasing members on a second pad collectively exerts a second compressive force on a corresponding second integrated circuit different than the first compressive force.

Any of the aspects herein, wherein each of the plurality of apertures comprises a peripheral wall and a ledge extending interiorly of the peripheral wall, the peripheral wall and ledge being spaced from an adjacent surface of a pad in a corresponding aperture, wherein a lateral movement of each pad is constrained by the peripheral wall in the corresponding aperture, and wherein the downward movement of each pad is constrained by the ledge in the corresponding aperture.

Any of the aspects herein, wherein each of the plurality of pads directly engages the opposing surface of the heat removal component only through the plurality of biasing members engaging the corresponding pad.

Any of the aspects herein, wherein the plurality of biasing members comprises a plurality of compressive springs, the compressive springs having substantially equivalent spring constants.

Any of the aspects herein, wherein each of the plurality of biasing members is configured to cause the portion of the corresponding one of the plurality of pads to maintain a constant compressive force on the opposing surface of the corresponding one of the plurality of integrated circuits to maintain a substantially uniform rate of heat transfer between the opposing surfaces of the corresponding one of the plurality of pads and the corresponding one of the plurality of integrated circuits.

Any of the aspects herein, wherein each of the plurality of biasing members is configured to cause the portion of the corresponding one of the plurality of pads to maintain a constant compressive force on the opposing surface of the corresponding one of the plurality of integrated circuits to maintain a substantially uniform rate of heat transfer between the opposing surfaces of the corresponding one of the plurality of pads and the corresponding one of the plurality of integrated circuits.

An electronic package comprises a heat removal component, a bottom cover, a condenser plate, a plurality of pads and one or more heat-pipes. The heat removal component provides a top cover surface for the electronic package and the bottom cover includes a printed circuit board and a plurality of integrated circuits attached to the printed circuit board. The condenser plate is sandwiched between the heat removal component and the bottom cover. The condenser plate includes a plurality of apertures. Each of the plurality of apertures overlaps a location of a corresponding one of the plurality of integrated circuits. Each of the plurality of pads is disposed within each of the plurality of apertures of the condenser plate and is configured to move in a vertical direction. The one or more heat-pipes are attached to the condenser plate and the plurality of pads and are configured to move in the vertical direction. Each of the plurality of pads is configured to be in thermal connection with the corresponding one of the plurality of integrated circuits by a movement of the one or more heat-pipes in the vertical direction to transfer to the condenser plate, thermal energy received by each of the plurality of pads from the plurality of integrated circuits. The heat removal component, the condenser plate and the bottom cover are rigidly connected to each other.

Any of the aspects herein, further comprising a plurality of biasing members engaging each pad of the plurality of pads and an opposing surface of a heat removal component in thermal connection with the condenser plate, each of the plurality of biasing members being configured to apply a compressive force to a portion of a corresponding one of the plurality of pads and the opposing surface of the heat removal component in response to movement of the portion of the corresponding one of the plurality of pads.

Any of the aspects herein, wherein each of the plurality of apertures comprises a peripheral wall and a ledge extending interiorly of the peripheral wall, the peripheral wall and ledge being spaced from an adjacent surface of a pad in a corresponding aperture, wherein a lateral movement of each pad is constrained by the peripheral wall in the corresponding aperture, and wherein the downward movement of each pad is constrained by the ledge in the corresponding aperture.

Any of the aspects herein, wherein each of the plurality of pads directly engages the opposing surface of the heat removal component only through the plurality of biasing members engaging the corresponding pad.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages of the present disclosure will become apparent to those skilled in the art upon consideration of the embodiment descriptions provided hereinbelow.

BRIEF DESCRIPTION OF THE DRAWINGS

FIG. 6A shows a simplified cross-sectional view of the electronic package before the first and second subassemblies are attached in accordance with embodiments of the present disclosure.

FIG. 6B shows a simplified cross-sectional view of the electronic package after the first and second subassemblies are attached in accordance with embodiments of the present disclosure.

DETAILED DESCRIPTION

Figure 1:
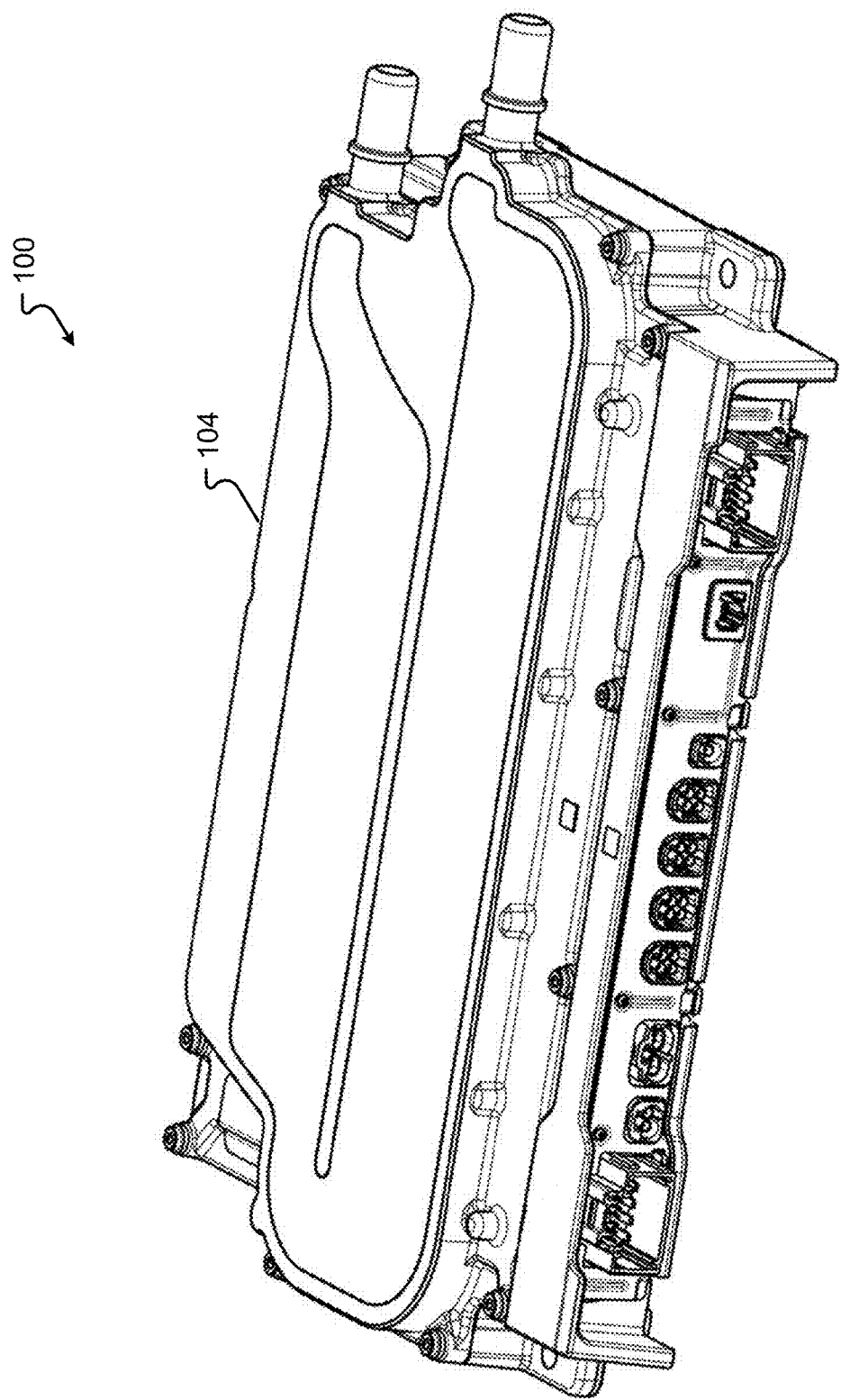
FIG. 1 shows a top perspective view of an electronic package in accordance with embodiments of the present disclosure.

Embodiments of the present disclosure will be described in connection with electronic packaging, and in some embodiments, the construction, structure, and arrangement of elements making up a sealable multi-surface electronic thermal conduction package.

In some embodiments, the present disclosure describes a heat-pipe assembly including spring-loaded thermal transfer devices for multiple high-power-density electronic processors. For example, an electronic package may be provided that includes multiple high-powered processors. The high-powered processors may include system on chips (SOCs), which may be microchips with all necessary electronic circuits and parts for a given system, such as computer chips, on a single integrated circuit. In some embodiments, the electronic package may be used in a vehicle, for example, to assist in autonomous handling and driving of the vehicle, where the SOCs provide computations and/or other features for operating the vehicle. While described in the context of a vehicle, the electronic package described herein may be used for other purposes. Additionally, the spring-loaded thermal transfer devices described herein may be used for any given electronic package that includes multiple high-power-density electronic processors that necessitates cooling to operate efficiently.

Thermal management of high-powered processors have existed for some time. That is, most electronic devices or electronic packages generate heat while in use (e.g., typically generated by the flow of electric current through one or more resistive elements and/or components in the electronic device). When the heat generated by these elements and/or components is not efficiently removed, the temperatures of an electronic device can exceed a normal operating range, where operating the electronic device at temperatures outside of the normal operating range (even periodically) can cause premature failures in the electronic device and/or result in shorter life spans of components in the electronic device. Conventional solutions for enabling thermal management of electronic devices focus on cooling a single processor by carrying the heat from the processor of the electronic device to a dedicated cooling element/system such as for example, a heatsink or a cold-plate, where the heat is absorbed by the cooling system and then dissipated to an external environment away from the electronic device. In some cases, each given processor includes its own cooling element to achieve a simpler design where it is easier to isolate out mechanical tolerance issues.

If an electronic device or package includes multiple processors, the solution of efficient thermal management becomes complicated. For example, the multiple processors may have different heights compared to each other due to different heights for different types of processors and/or height differences of the same types of processors based on different tolerances (e.g., each of the processors may be attached in a same package with varying heights of solder used for the attaching). Additionally, each of the processors may be required to maintain equal performance for each of their locations in the electronic package, which may further complicate the thermal management of the processors and electronic device.

As described herein, a heat-pipe assembly is provided which includes spring-loaded thermal transfer devices designed to thermally connect multiple individual processors (e.g., SOCs or SOC processors) on separate printed circuit boards (PCBs) in an electronic package to a cooling system of the electronic package. In some embodiments, the processors (e.g., SOCs) may be located on any number of separate PCBs or they may be all located on a same PCB. For example, the number of processors/SOCs in the electronic package may be greater than or equal to a number of PCBs in the electronic package. In some embodiments, the multiple individual processors may include four (4) processors that are cooled using the single heat-pipe assembly. Additionally, or alternatively, the heat-pipe assembly provided and described herein may be used to provide thermal management and cooling to any given number of processors (e.g., less than four (4) processors or greater than four (4) processors).

The cooling system may include a cold-plate that may be a common water-cooled cold-plate (or may use a different coolant liquid) that absorbs the heat generated by the processors based on the heat being transferred to the cold-plate via the heat-pipe assembly to provide the thermal management. As referenced and described herein, the cold-plate may be any given type of heatsink device or heat removal component configured to absorb heat generated within the electronic package and then dissipated external to the electronic package. For example, while referred to as a cold-plate, the corresponding heat removal component may be a finned heatsink (e.g., uses natural convection and not a fan to remove the generated heat), a finned heatsink plus a fan (e.g., uses forced convection to remove the generated heat), a thermal siphon, a vapor chamber, etc. In some examples, the component used to remove the generated heat from the electronic package may be generally referred to as a thermal heatsink and not limited to only a cold-plate.

Additionally, the heat-pipe assembly may include a number of spring-loaded thermal transfer devices or pads (e.g., "spreader" pads, heat spreaders, cooling pads, etc.) that correspond to the number of processors in the electronic package. For example, if the electronic package includes four (4) processors, then the heat-pipe assembly may include four (4) pads (e.g., one pad per processor in the electronic package). Accordingly, each of the pads may be configured to contact a respective processor (e.g., a respective high-powered SOC) by having springs push down on each pad individually. That is, each pad may have a respective set of springs attached to them, such that each pad can be moved independently of the other pads to make contact with a corresponding processor on an individual basis. By using the springs, the heat-pipe assembly is able to accommodate for various heights of each processor due to various manufacturing tolerances (e.g., different heights of each processor, different amounts/heights of solder applied to adhere the processors in the electronic package, or other manufacturing and/or assembling differences associated with each processor).

In some embodiments, the heat-pipe assembly may first be mounted to the cooling system creating a first subassembly and then the first subassembly is mounted onto a second subassembly that includes the multiple processors during a final step of the assembly for the electronic package. By mounting the heat-pipe assembly to the cooling system first and then attaching the cooling system (e.g., with one or more heat-pipes already mounted to the cooling system) to the second subassembly that includes the multiple processors, any assembly tolerances may cumulate in a gap between the heat-pipe assembly and the second subassembly with the processors, such that a z-compliance of the heat-pipe assembly (e.g., available space for the pads to move in the z-direction) absorbs the assembly tolerances while still providing optimal thermal management for each processor.

The heat-pipe assembly, in addition to the pads and springs described previously, may include a condenser plate and a set of one or more bent heat-pipes that provide both thermal conduction and mechanical locating of the pads (e.g., heat spreaders) in relation to the condenser plate. The condenser plate may be the component of the heat-pipe assembly that is mounted to the cooling system, where the pads and the one or more heat-pipes (e.g., a set of one or more bent heat-pipes) are adhered to the condenser plate before the condenser plate is attached to the cooling system. For example, the pads and the one or more heat-pipes may be soldered onto the condenser plate, and the condenser plate may then be screwed onto or otherwise attached to the cooling system. In some examples, the one or more heat-pipes may also be adhered (e.g., soldered) onto the pads. Additionally, as described previously, each of the pads may have a respective set of springs attached to them (e.g., via soldering or another means of attachment not explicitly provided herein).

The springs on each pad may provide a downward compression (e.g., in a direction opposite the cooling system and towards the processors) to cause each individual pad to come into contact with a corresponding processor of the electronic package. The springs may be easily installed (e.g., on each pad) and then captured between a top surface of the heat-pipe assembly and a bottom surface of the cooling system when the heat-pipe assembly is attached to the cooling system. The captured springs may provide a high degree of reliability for providing an individualized optimal thermal management solution for each processor and may avoid any risk of the springs falling out or otherwise failing. The springs may push each pad down with the one or more heat-pipes that are attached to each pad to provide a high level of compliance in assembly of the electronic package and to accommodate for any differences in height among the processors. For example, the one or more heat-pipes of the heat-pipe assembly may be deformable, flexible, bendable, or otherwise not rigid to enable movement of the one or more heat-pipes with the pads based on the compression/directional force exerted by the springs.

Embodiments of the present disclosure provide technical solutions to one or more of the problems of (1) providing efficient thermal management of multiple high-powered processors (e.g., SOCs) in an electronic package with a single cooling system, (2) potentially damaging the high-powered processors and/or other components in the electronic package, (3) accounting for varying heights of the multiple high-powered processors, and (4) preventing vibrations from impacting performance of the electronic package and/or damaging components in the electronic package. For example, the flexible one or more heat-pipes of the heat-pipe assembly may provide a thermal connection between the pads and the cooling system to assist in heat removal. The springs may also be positioned and configured to push the one or more heat-pipes and pads towards the high-powered processors rather than pulling the high-powered processors towards the heat control surface (e.g., the pads and/or cooling system), thereby preventing potential deformation and/or damage to the processors and PCBs to which the processors are attached while still providing efficient thermal management for each processor. Additionally, the rigid positioning of the cooling system coupled to the heat-pipe assembly (e.g., with the use of the flexibly mounted one or more heat-pipes and pads in thermal contact with the cooling system) may enable the heat-pipe assembly to accommodate for differing heights of the processors (e.g., from manufacturing tolerances) using the springs and may provide an assembly that avoids transferring vibrations and impacts (e.g., from vehicle motion) to the PCB of which the processors are attached.

Turning now to FIG. 1, a top perspective view 100 of an electronic package 104 is provided in accordance with embodiments of the present disclosure. In some embodiments, the electronic package 104 may be designed to provide functions to and/or assist in operating a vehicle. For example, the electronic package 104 may be a computer module for use in a vehicle. In some examples, the functions provided by the electronic package 104 may include critical functions for the vehicle, such as autonomous driving operations, navigation, RADAR, vehicle controls, communications (e.g., vehicle-to-vehicle (V2V) or vehicle-to-everything (V2X) communications), etc. Additionally, the vehicle described herein may include any conveyance or model of a conveyance, where the conveyance was designed for the purpose of moving one or more tangible objects, such as people, animals, cargo, and the like. The term "vehicle" does not require that a conveyance moves or is capable of movement. Typical vehicles may include but are in no way limited to electric vehicles, cars, trucks, motorcycles, busses, automobiles, trains, railed conveyances, boats, ships, marine conveyances, submarine conveyances, airplanes, space craft, flying machines, human-powered conveyances, and the like.

As described herein, the electronic package 104 may include multiple high-powered processors. The high-powered processors may be referred to as SOCs or integrated circuits or may include SOCs. SOCs may be microchips with all necessary electronic circuits and parts for a given system, such as computer chips or chips that enable/provide a system in a vehicle, on a single integrated circuit. For example, the SOCs may perform computations and/or provide other features for operating the vehicle. In some examples, the multiple SOCs may operate together (e.g., or in subsets) to provide features for operating the vehicle, and/or individual SOCs may provide separate features for operating the vehicle. While described in the context of a vehicle, the electronic package 104 described herein may be used for providing other purposes and in other contexts not explicitly described herein.

While in use, the electronic package 104 may generate heat, for example, typically generated by the flow of electric current through one or more resistive elements and/or components of the electronic package 104, such as the high-powered processors described above. If the heat generated in the electronic package 104 (e.g., via the high-powered processors) is not efficiently removed, temperatures of the electronic package 104 may exceed a normal operating range. In some examples, operating the electronic package 104 at temperatures outside of the normal operating range (even periodically) can cause premature failures in the electronic package 104 and/or result in shorter life spans of components in the electronic package 104.

As described in greater detail with reference to FIGS. 2, 3A, 3B, 3D, 4A, 4B, 6A and 6B, the electronic package 104 may include spring-loaded thermal transfer pads to provide optimal thermal management for multiple high-power-density electronic processors (e.g., multiple SOCs) in the electronic package 104. The spring-loaded thermal transfer pad described herein may be used for any given electronic package that includes multiple high-power-density electronic processors that necessitate cooling to operate efficiently.

Figure 2:
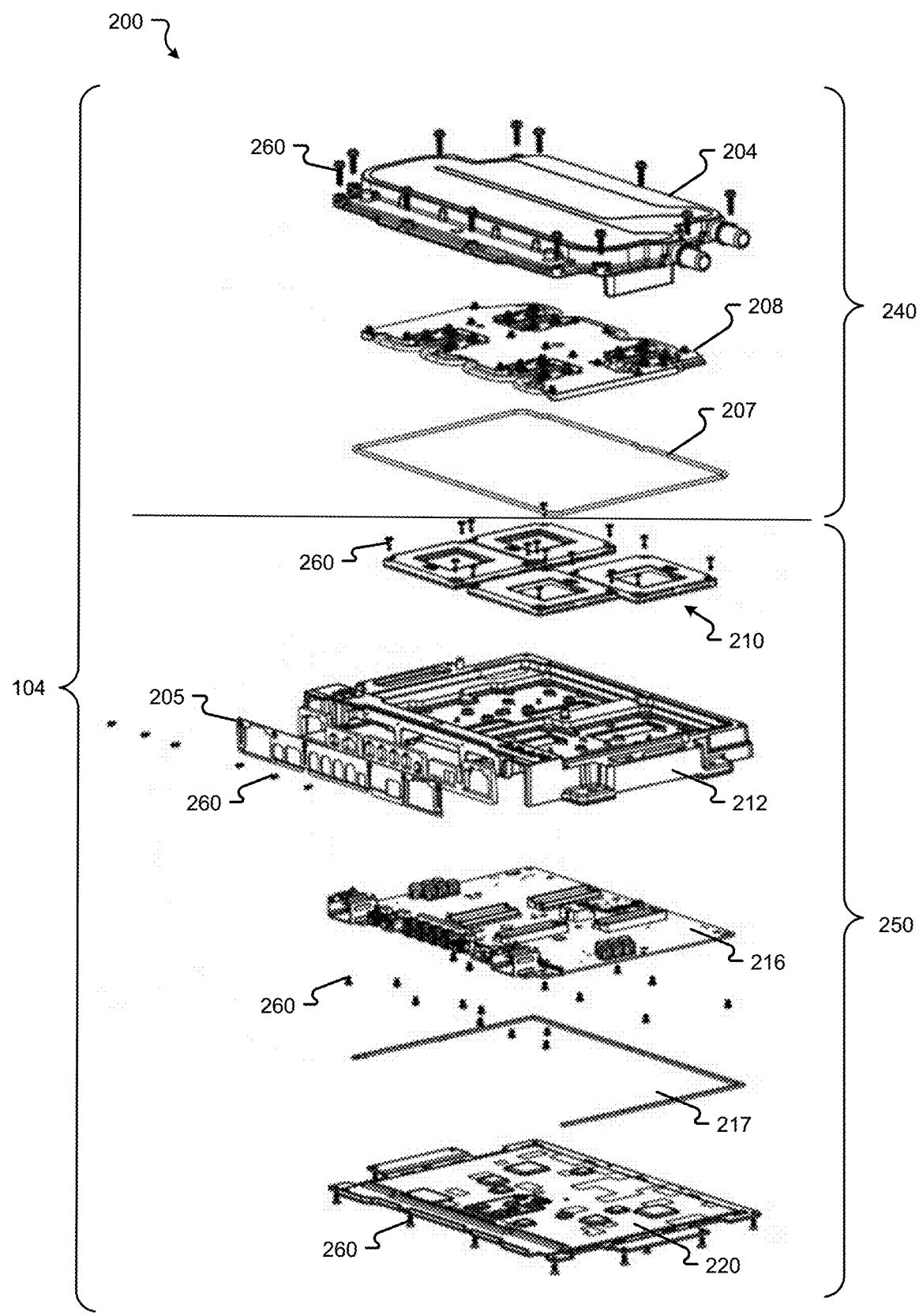
FIG. 2 shows a perspective exploded view of the electronic package of FIG. 1 in accordance with embodiments of the present disclosure.

FIG. 2 depicts a perspective exploded view 200 of the electronic package in accordance with embodiments of the present disclosure. In some examples, the perspective exploded view 200 as described with reference to FIG. 2 may implement aspects of or may be implemented by aspects of FIG. 1. For example, the perspective exploded view 200 of the electronic package may be an exploded view of different components included in the electronic package 104 as described with reference to FIG. 1.

As shown in the perspective exploded view 200, the electronic package 104 may include a cooling system 204, a heat-pipe assembly 208, a middle plate 212, a main printed circuit board (PCB) 216, and a bottom cover 220. In some examples, the cooling system 204 may provide a top cover surface for the electronic package 104. Additionally, the cooling system 204 may include a chamber with an inlet and an outlet to enable a flow of coolant liquid through the chamber. For example, the coolant liquid may be water or another liquid that absorbs heat generated by other components of the electronic package 104 (e.g., the middle plate 212, the main PCB 216, processors, integrated circuits, SOCs, etc.) to be dissipated to the surrounding environment or elsewhere external to the electronic package 104.

The heat-pipe assembly 208 may represent an assembly for providing cooling to a plurality of integrated circuits as described herein. Components of the heat-pipe assembly 208 are shown and described in greater detail with reference to FIGS. 3A-3G. The heat-pipe assembly 208 may be attached to the underside of the cooling system 204. In some examples, the underside of the cooling system 204 and/or a topside of the heat-pipe assembly 208 may have a thermal interface material (TIM) or a thermal grease applied to their surfaces, where the thermal grease may improve thermal conductivity between the heat-pipe assembly 208 and the cooling system 204. For example, the heat-pipe assembly 208 may be configured to absorb heat generated from other components in the electronic package 104 (e.g., the middle plate 212, the main PCB 216, processors, integrated circuits, SOCs, etc.) and then transfer the absorbed heat to the cooling system 204 based in part on the thermal grease, where the transferred heat is dissipated away from the components of the electronic package 104 via the cooling system 204 as described above.

In some examples, the cooling system 204 and the heat-pipe assembly 208 may be attached together in a first subassembly 240 of the electronic package 104. Additionally, the electronic package 104 may include a second subassembly 250 including the middle plate 212, the main PCB 216, and the bottom cover 220. In some instances, the second subassembly 250 may also include one or more faceplates 205. For example, the middle plate 212 may be attached to the main PCB 216, such that multiple integrated circuits (e.g., multiple SOCs, chips, processors, etc.) of the middle plate 212 are electrically coupled to the main PCB 216.

In some examples as illustrated in FIG. 2, the multiple integrated circuits of the middle plate 212 may be parts of respective daughter cards and/or a same daughter card 210 that are attached and electrically coupled to the main PCB 216 via the middle plate 212. The daughter card(s) 210 may provide complementary or supplementary functions to the main PCB 216 stored in the electronic package 104. For example, the daughter card(s) 210 may be types of circuit boards that plug in or are attached to a motherboard or similar expansion card (e.g., the main PCB 216) to extend features and services of the motherboard or similar expansion card. That is, the daughter card 210 may complement or supplement an existing functionality of a motherboard or an expansion card. The daughter card(s) 210 (and/or the main PCB 216) may, in part, provide a function for a vehicle (e.g., electrical vehicle) but is not limited to such examples.

Additionally, the daughter card(s) 210 may require high amounts of power to provide the complementary/supplementary functions, where the high amounts of power cause heat to be generated in the electronic package 104 based, in part, on the flow of electric current needed to supply the high amounts of power passing through the integrated circuits of the middle plate 212 (e.g., and/or other resistive elements and/or components of the middle plate 212). Accordingly, the heat-pipe assembly 208 may be configured to absorb the generated heat from the integrated circuits (e.g., SOCs) of the middle plate 212 to prevent temperatures of the electronic package 104 from exceeding normal operating temperatures and, thereby, lessening the chances of premature failures of the electronic package 104 and/or components within the electronic package 104.

However, in some cases, one or more of the integrated circuits of the middle plate 212 may be different heights than the other integrated circuits of the middle plate 212 (e.g., different heights relative to a top surface of the middle plate 212). As such, based on the different heights, ensuring sufficient contact between the integrated circuits and components of the heat-pipe assembly 208 may become complicated, where the components of the heat-pipe assembly 208 are configured to absorb the generated heat from the integrated circuits via conducting the heat through physical contact. As provided and described herein, the heat-pipe assembly 208 may include a spring-loaded thermal transfer pad having springs used to ensure contact between the individual integrated circuits and respective pads of the heat-pipe assembly 208 that are configured to absorb the generated heat from the integrated circuits. Configurations of the heat-pipe assembly 208 with the corresponding pads and springs configured for absorbing the heat are shown and described in greater detail with reference to FIGS. 3A-3E.

The middle plate 212 and the main PCB 216 may be attached, and the combined middle plate 212 with the main PCB 216 may be attached to the bottom cover 220 to form the second subassembly 250. The first subassembly 240 including the cooling system 204 and the heat-pipe assembly 208 may then be attached to the second subassembly 250 including the middle plate 212, the main PCB 216, and the bottom cover 220. Accordingly, when the first subassembly 240 is attached to the second subassembly 250, the springs of the heat-pipe assembly 208 (described previously) compress to ensure contact between the integrated circuits of the middle plate 212 (e.g., of possible different heights) and the components of the heat-pipe assembly 208. Attachment of the first subassembly 240 to the second subassembly 250 to compress the springs for ensuring contact between the integrated circuits of the middle plate 212 and the components of the heat-pipe assembly 208 is described in greater detail with reference to FIGS. 4A, 4B, 5, 6A and 6B.

The electronic package 104 may also include a plurality of other components that fit between the other components described above. For example, the electronic package 104 may include one or more gaskets 217, o-rings 207, thermal spacers, clamps, and/or other components between the cooling system 204 and the heat-pipe assembly 208, between the middle plate 212 and the main PCB 216, between the main PCB 216 and the bottom cover 220, between the first subassembly 240 and the second subassembly 250 (e.g., substantially between the heat-pipe assembly 208 and the middle plate 212), etc. In some examples, the plurality of other components may be configured to ensure dust, air, or other particles get in between any of the components of the electronic package 104 (e.g., the plurality of other components is used for providing a hermetic seal to the processors, integrated circuits, SOCs, the main PCB 216, etc.). Additionally, the plurality of other components may provide other forms of protection to the components of the electronic package 104. For example, the plurality of other components may provide structural support within the electronic package 104 (e.g., to prevent any of the components from being compressed or distorted), spacing between the components (e.g., to prevent heat from being trapped in different areas of the electronic package 104), or other forms of protection not described herein and outside the scope of the present disclosure. Additionally, the electronic package 104 may include a plurality of screws 260 for adjoining any given components of the electronic package 104.

Figure 3A:
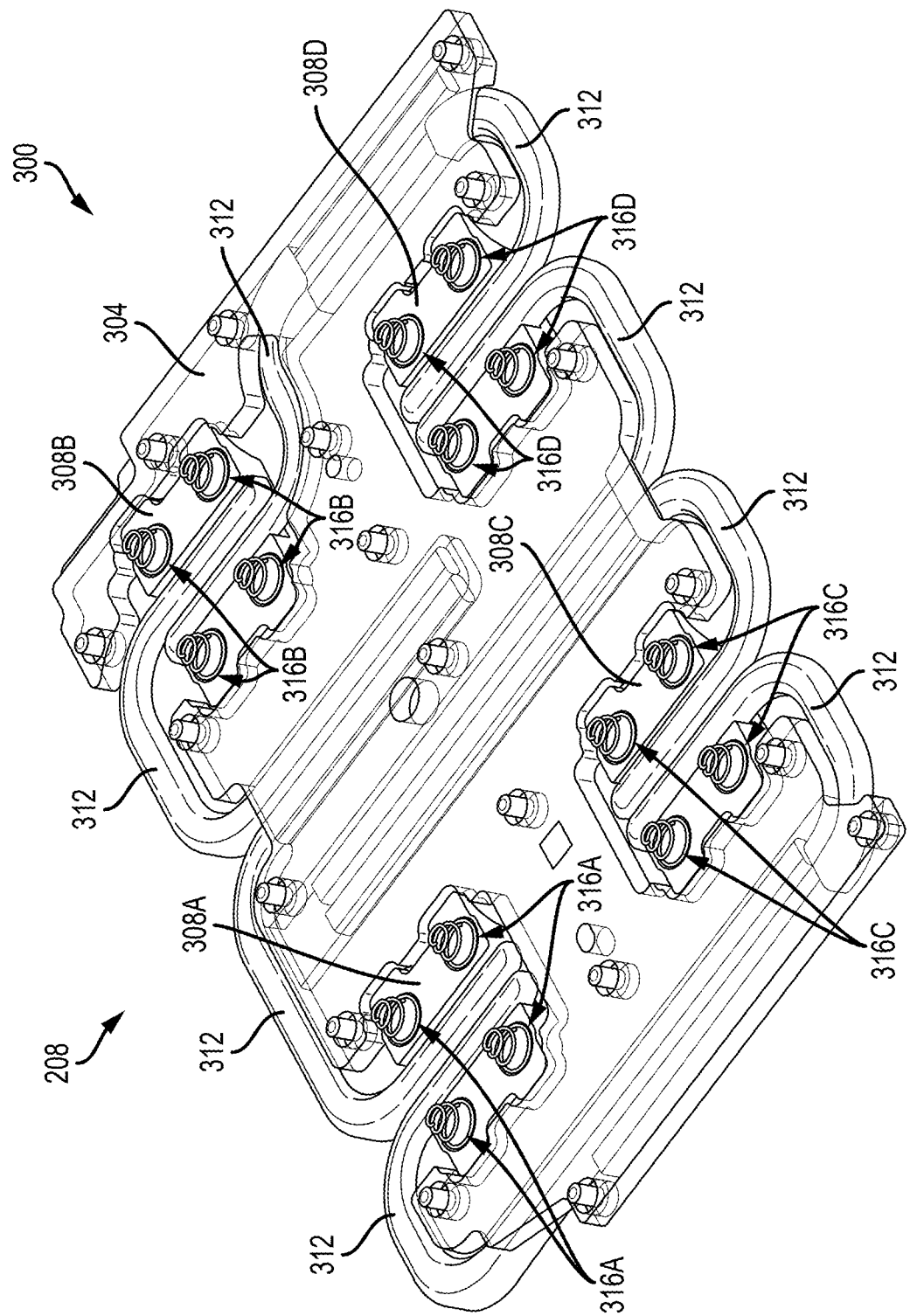
FIG. 3A shows a top perspective view of a heat-pipe assembly in an assembled state in accordance with embodiments of the present disclosure.

FIG. 3A depicts a top perspective view 300 of the heat-pipe assembly 208 in an assembled state in accordance with embodiments of the present disclosure. In some examples, the top perspective view 300 as described with reference to FIG. 3A may implement aspects of or may be implemented by aspects of FIGS. 1 and 2. For example, the top perspective view 300 of the heat-pipe assembly 208 may be a view of the heat-pipe assembly 208 as described with reference to FIG. 2, which may be part of the electronic package 104 as described with reference to FIGS. 1 and 2. In some examples, as described previously, the heat-pipe assembly 208 may include spring-loaded thermal transfer pads having springs to ensure contact between individual integrated circuits (e.g., of the middle plate 212 as described with reference to FIG. 2) and respective components of the heat-pipe assembly 208 that are configured to absorb the generated heat from the integrated circuits.

The heat-pipe assembly 208 may include a condenser plate 304, a plurality of pads 308, and one or more heat-pipes 312. In some examples, the condenser plate 304 may be configured to be installed between a cooling system and a middle plate assembly of the electronic package 104. That is, the condenser plate 304 is, attached to the cooling system 204 as described with reference to FIG. 2, which is then attached to a second subassembly 250 (i.e., the middle plate assembly) that includes the middle plate 212, the main PCB 216, and the bottom cover 220 as described with reference to FIG. 2). Additionally, in some examples, the condenser plate 304 may be made of aluminum, an aluminum alloy, or another material with sufficient thermal conductive properties to transfer absorbed heat from the integrated circuits of the electronic package 104 to the cooling system 204.

In some examples, the plurality of pads 308 may be adhered to the condenser plate 304 (e.g., via soldering). Additionally, the plurality of pads 308 may be positioned on the condenser plate 304 to substantially correspond to locations of the integrated circuits in the electronic package 104 (e.g., on the middle plate 212). The locations of the plurality of pads 308 with reference to the integrated circuits of the electronic package 104 is described in greater detail with reference to FIGS. 4A, 4B, 6A and 6B.

As shown in the example of FIG. 3A, the heat-pipe assembly 208 may include four (4) pads. For example, the heat-pipe assembly 208 may include a first pad 308A, a second pad 308B, a third pad 308C, and a fourth pad 308D. Additionally or alternatively, although not shown, the heat-pipe assembly 208 may include a lesser number or a greater number of pads for the plurality of pads 308 than four (4). In some examples, the number of pads in the plurality of pads 308 may correspond to a number of integrated circuits of the middle plate 212 in the electronic package 104 (e.g., the electronic package 104 is configured to have one pad per integrated circuit), or the number of pads in the plurality of pads 308 may be different than the number of integrated circuits of the middle plate 212.

The one or more heat-pipes 312 may be adhered to the condenser plate 304 and the plurality of pads 308 (e.g., via soldering). In various examples, the one or more heat-pipes 312 may be configured to transfer thermal energy produced by the integrated circuits of the electronic package 104 (e.g., heat generated by the integrated circuits, SOCs, processors, etc.) from the plurality of pads 308 to the condenser plate 304. In some examples, the one or more heat-pipes 312 may be thin-walled constructed tubes that are vapor-sealed. The one or more heat-pipes 312 may be constructed of copper, a copper alloy, or another material with similar heat/thermal conductivity characteristics. In various examples, the one or more heat-pipes 312 may be flexible or elastic because of an inherent stiffness and can act as a spring member and the one or more flexible heat-pipes 312 are able to move up and down. Moreover, the one or more flexible heat-pipes 312 are configured to exert a directional force on the plurality of pads 308 when the electronic package 104 is fully assembled, such that each of the plurality of pads 308 are individually moved to come into contact with a corresponding integrated circuit of the electronic package 104.

In some examples, each of the plurality of pads 308 may include a plurality of sets of springs 316 adhered to a respective pad of the plurality of pads 308 (e.g., using a plurality of indentations and adhered, for example, via soldering within the corresponding indentations) so as the springs 316 may be disposed on a top surface of the heat-pipe assembly 208. In some other instances, the springs 316 may be disposed on the bottom surface of the cooling system 204. As shown in the example of FIG. 3A, the heat-pipe assembly 208 may include four (4) sets of springs in the plurality of sets of springs 316. For example, the number of sets of springs in the plurality of sets of springs 316 may correspond to the number of pads in the plurality of pads 308 of the heat-pipe assembly 208 (e.g., each pad 308 of the heat-pipe assembly 208 may have a respective set of springs adhered to them).

As described herein and provided in the present disclosure, the plurality of sets of springs 316 may be configured to exert a directional force on the plurality of pads 308 when the electronic package 104 is fully assembled, such that each of the plurality of pads 308 are individually moved to come into contact with a corresponding integrated circuit of the electronic package 104. Subsequently, the thermal energy produced by the integrated circuits of the electronic package 104 may be transferred from the middle plate 212 to the cooling system 204 of the electronic package 104 via the condenser plate 304, the plurality of pads 308, and the one or more heat-pipes 312 based on the plurality of sets of springs 316 and the directional force exerted by the plurality of springs 316. For example, the directional force exerted on the plurality of pads 308 by the plurality of sets of springs 316 is designed to move the plurality of pads 308 away from the cooling system 204 and towards the electronic package 104 to enable physical contact between each of the plurality of pads 308 and the integrated circuits of the electronic package 104, where the heat generated by the integrated circuits is absorbed by each of the plurality of pads 308 based on the enabled contact.

Figure 3B:
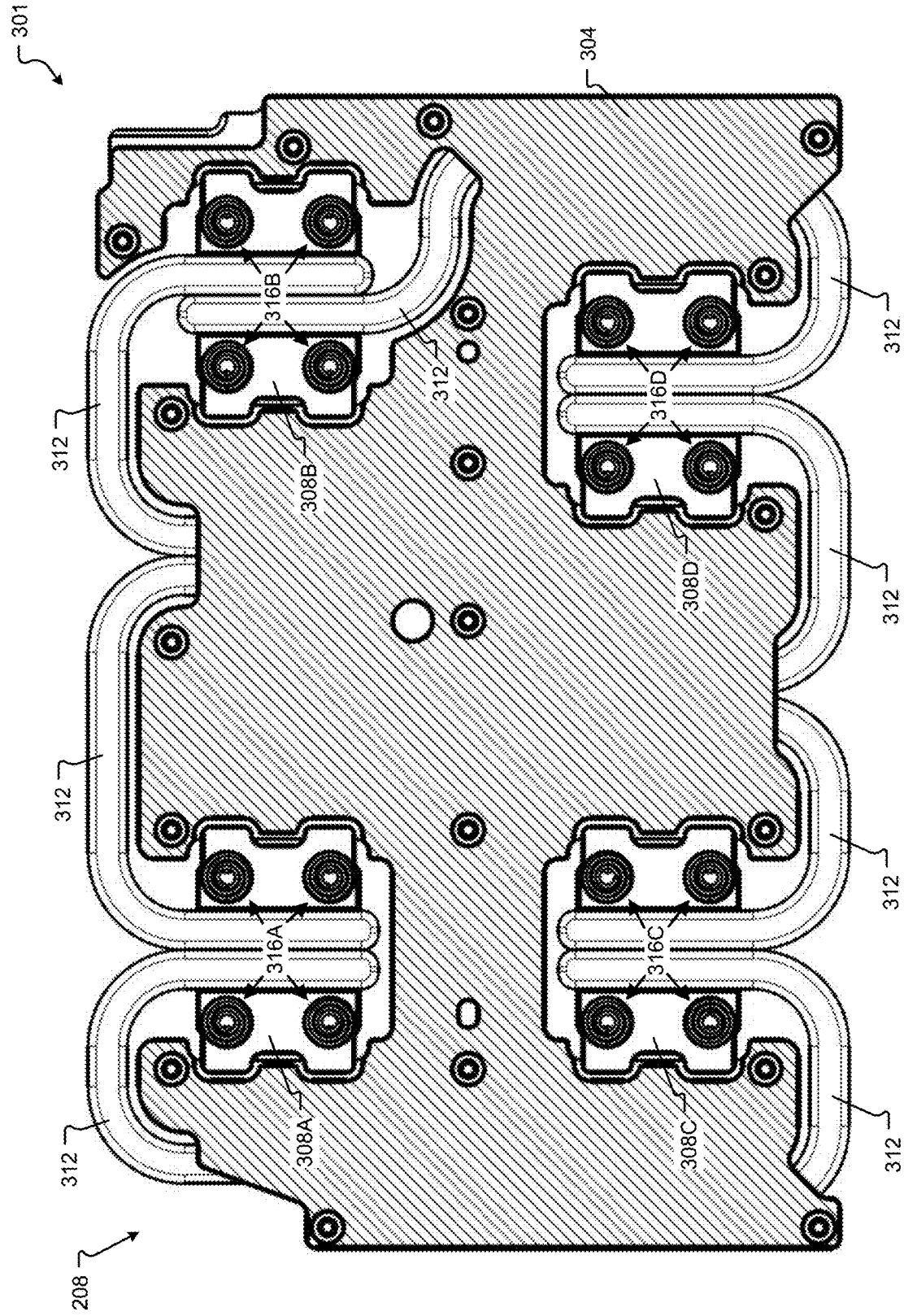
FIG. 3B shows a top plan view of the heat-pipe assembly in an assembled state in accordance with embodiments of the present disclosure.
Figure 3C:
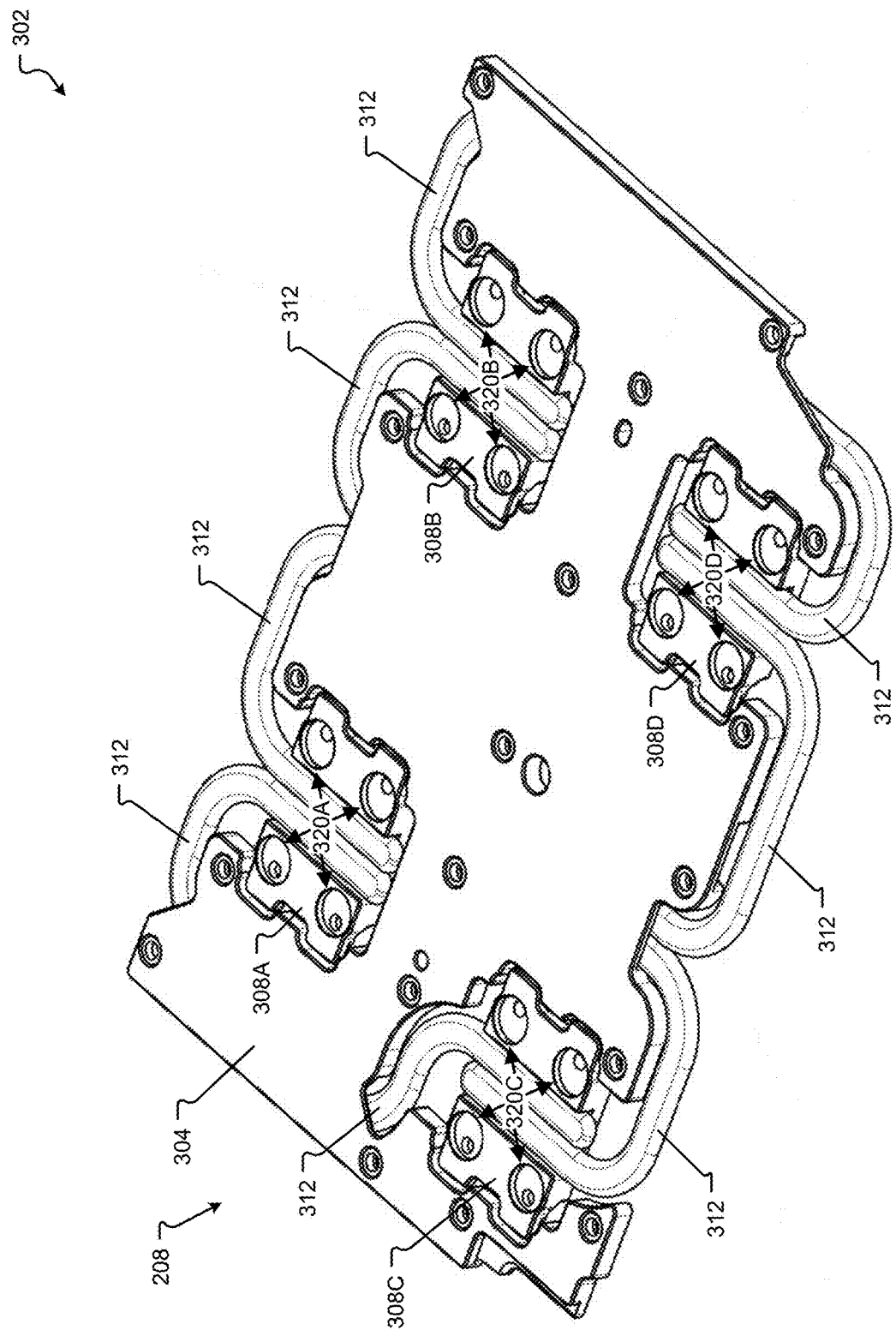
FIG. 3C shows a top perspective view of the heat-pipe assembly in a first assembly state in accordance with embodiments of the present disclosure.
Figure 3D:
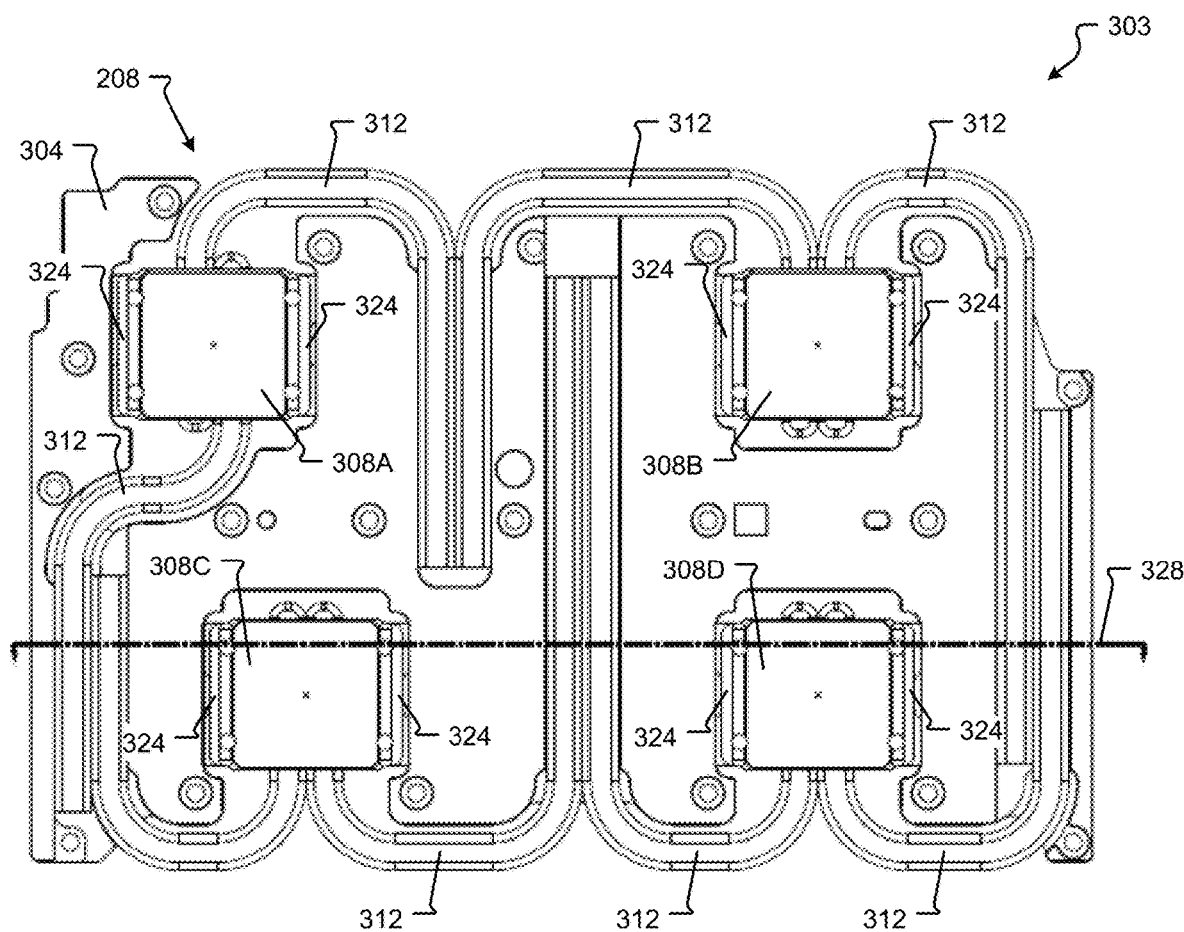
FIG. 3D shows a bottom plan view of the heat-pipe assembly in accordance with embodiments of the present disclosure.
Figure 3E:
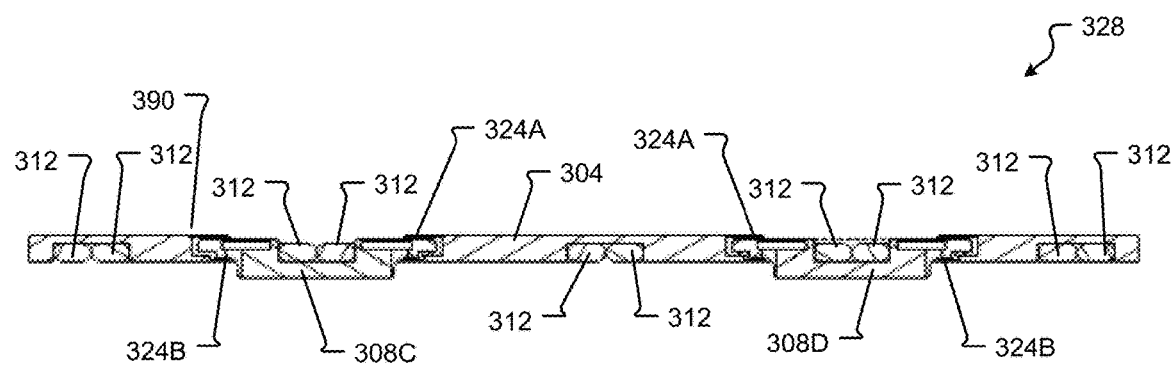
FIG. 3E shows a cross-sectional view of a bottom portion of the heat-pipe assembly in accordance with embodiments of the present disclosure.
Figure 3F:
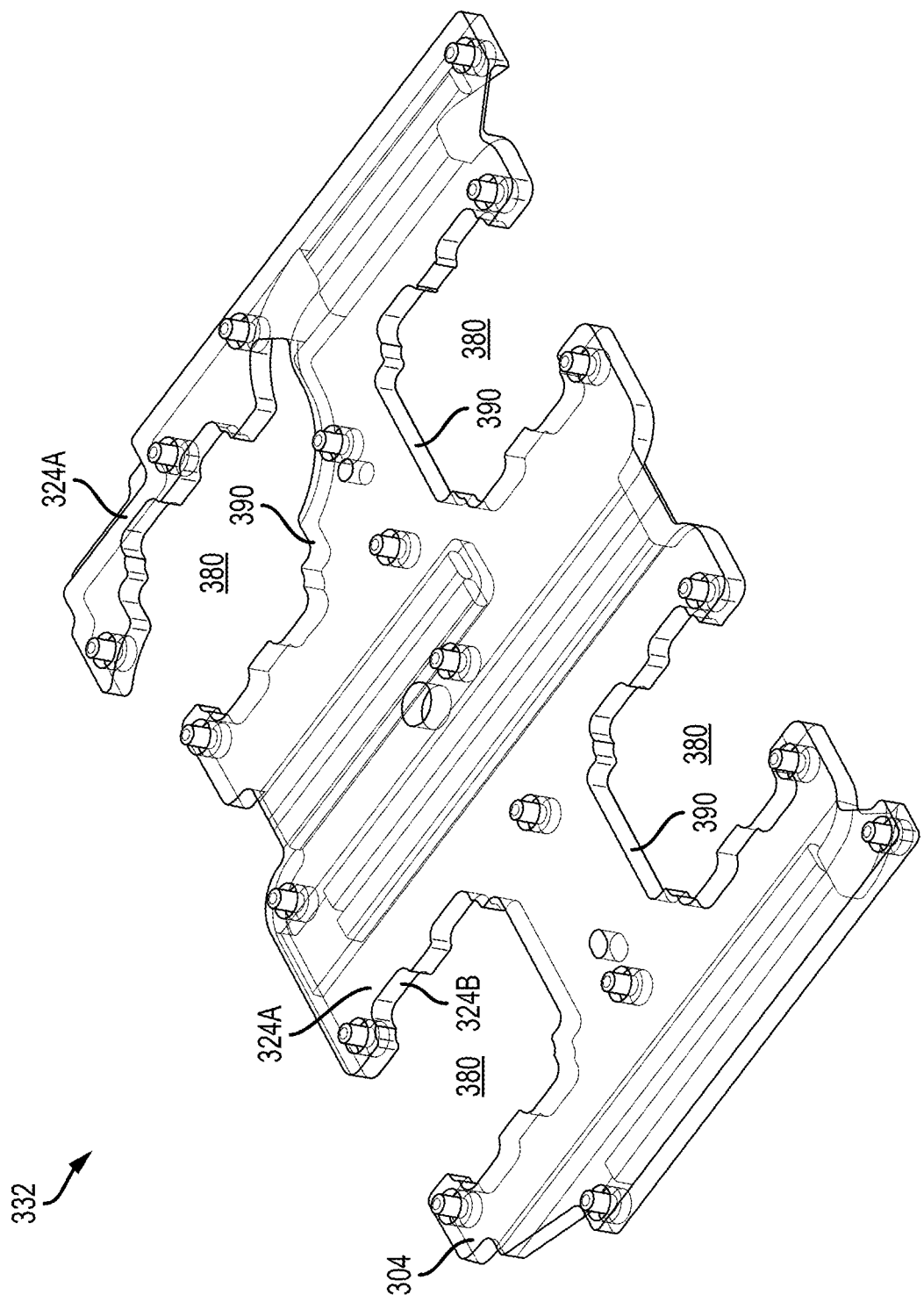
FIG. 3F shows a top perspective view of a condenser plate in accordance with embodiments of the present disclosure.
Figure 3G:
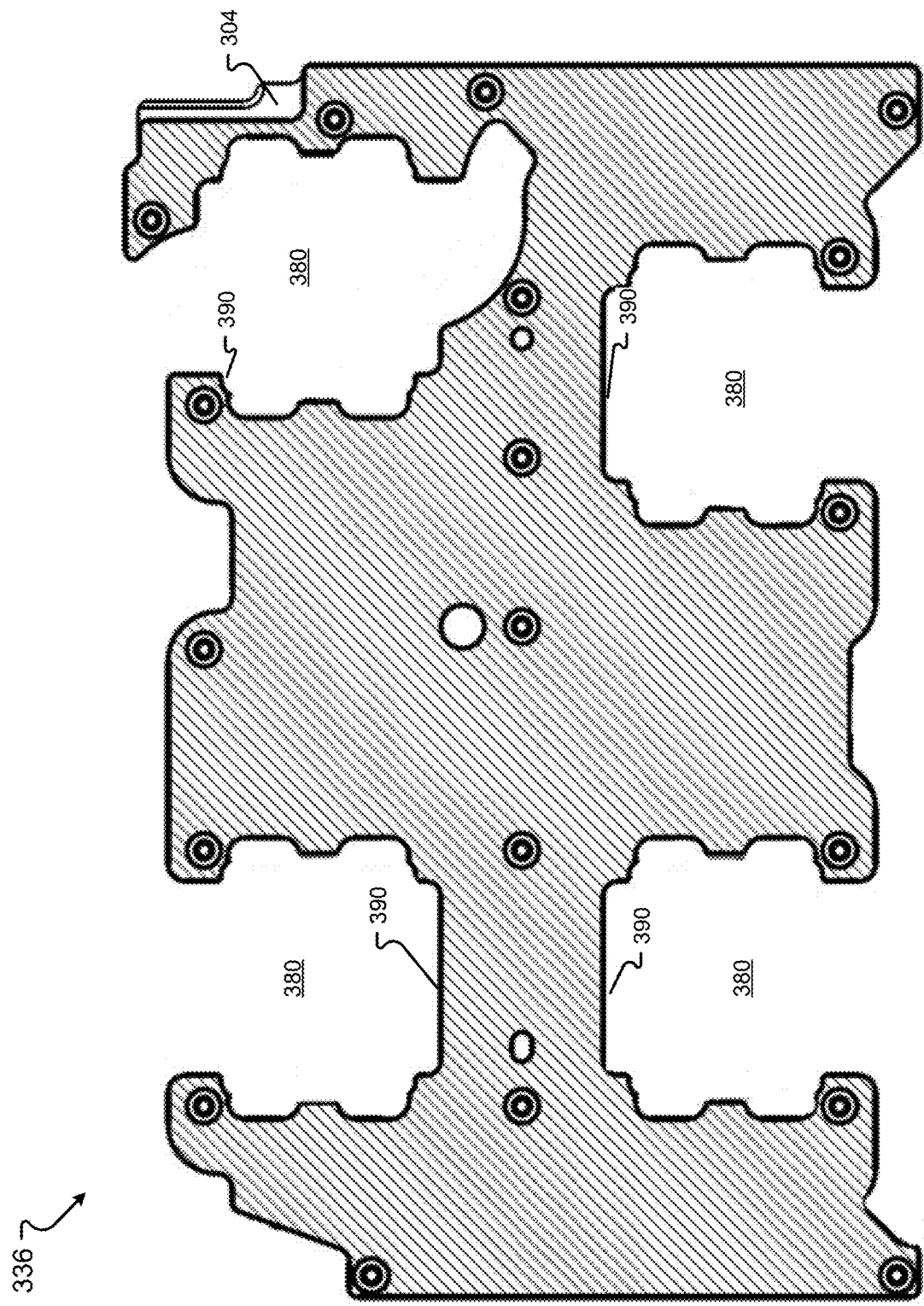
FIG. 3G shows a top plan view of the condenser plate in accordance with embodiments of the present disclosure.

In some examples, the condenser plate 304 may include a plurality of cutouts or apertures that are configured to accommodate a respective pad of the plurality of pads 308 as illustrated in more detail in FIGS. 3F and 3G. Additionally, each of the cutouts or apertures may include a bottom ledge along at least a portion of each cutout or aperture to limit a distance that each pad of the plurality of pads 308 is able to move based in part on the directional force exerted by the plurality of sets of springs 316. The bottom ledge of each cutout or aperture is shown and described in greater detail with reference to FIGS. 3E, 3F and 3G. In some examples, the one or more heat-pipes 312 may be flexible to enable movement with the plurality of pads 308 based on the plurality of springs 316 exerting the directional force to enable contact between each of the pads and the integrated circuits.

FIG. 3B depicts a top plan view 301 of a heat-pipe assembly 208 in an assembled state in accordance with embodiments of the present disclosure. In some examples, the top plan view 301 as described with reference to FIG. 3B may implement aspects of or may be implemented by aspects of FIGS. 1, 2, and 3A. For example, the top plan view 301 of the heat-pipe assembly 208 may be a view of the heat-pipe assembly 208 as described with reference to FIGS. 2 and 3A, which may be part of the electronic package 104 as described with reference to FIGS. 1 and 2.

The top plan view 301 of the heat-pipe assembly 208 may represent a different perspective of the configuration of the heat-pipe assembly 208 with the condenser plate 304, the plurality of pads 308, the one or more heat-pipes 312, and the plurality of sets of springs 316 as described in greater detail with reference to FIG. 3A. As described herein, each set of springs 316 may be configured to exert the directional force to push each pad 308 away from the cooling system 204 towards the integrated circuits of the electronic package 104, individually such that each pad 308 makes contact with an integrated circuit of the electronic package 104 (e.g., located on a middle plate 212 of the electronic package 104 attached below the heat-pipe assembly 208). Subsequently, each pad 308 may absorb heat generated by a corresponding integrated circuit (e.g., based on the physical contact between the components). Then, any heat-pipes of the one or more heat-pipes 312 that are attached to a given pad 308 may absorb the heat from the pads 308 to then transfer the heat to the condenser plate 304, where the condenser plate 304 is configured to further transfer the heat to the cooling system 204 of the electronic package 104 as described with reference to FIG. 1 to be dissipated external to the electronic package 104.

FIG. 3C depicts a top perspective view 302 of the heat-pipe assembly 208 in a first assembly state in accordance with embodiments of the present disclosure. In some examples, the top perspective view 302 as described with reference to FIG. 3C may implement aspects of or may be implemented by aspects of FIGS. 1, 2, 3A and 3B. For example, the top perspective view 302 of the heat-pipe assembly 208 may be a view of the heat-pipe assembly 208 as described with reference to FIGS. 2, 3A and 3B, which may be part of the electronic package 104 as described with reference to FIGS. 1 and 2. In some examples, the top perspective view 302 may represent a first assembly state for the heat-pipe assembly 208 where the plurality of sets of springs 316 as described with reference to FIGS. 3A and 3B have not been adhered to corresponding pads of the plurality of pads 308. According to an alternative embodiment of the present disclosure, the heat-pipe assembly 208 does not include the plurality of sets of springs 316, but instead, the one or more heat-pipes 312 act as spring members because the one or more heat-pipes 312 have an inherent stiffness and are able to move up and down.

As described with reference to FIG. 3C, each pad 308 may include a plurality of indentations 320 configured to accommodate each corresponding set of springs of the plurality of sets of springs 316. For example, the first pad 308A may include a first set of indentations 320A (e.g., configured to accommodate the first set of springs 316A), the second pad 308B may include a second set of indentations 320B (e.g., configured to accommodate the second set of springs 316A), the third pad 308C may include a third set of indentations 320C (e.g., designed to accommodate the third set of springs 316C), and the fourth pad 308D may include a fourth set of indentations 320D (e.g., configured to accommodate the fourth set of springs 316D).

FIG. 3D depicts a bottom plan view 303 of a heat-pipe assembly 208 in accordance with embodiments of the present disclosure. In some examples, the bottom plan view 303 as described with reference to FIG. 3D may implement aspects of or may be implemented by aspects of FIGS. 1, 2, 3A, 3B and 3C. For example, the bottom plan view 303 of the heat-pipe assembly 208 may be a view of the heat-pipe assembly 208 as described with reference to FIGS. 2, 3A, 3B and 3C, which may be part of the electronic package 104 as described with reference to FIGS. 1 and 2.

The bottom plan view 303 may illustrate a view of the bottom surface of the heat-pipe assembly 208, which includes the bottom surfaces of each of the plurality of pads 308. As shown, each pad 308 may include a flat surface on each bottom surface that, when pushed down based on the directional force exerted by the plurality of sets of springs 316 as described with reference to FIGS. 3A and 3B, come into contact with respective integrated circuits of the middle plate 212 attached in the electronic package 104 below the heat-pipe assembly 208. Accordingly, the flat surface on the bottom of each pad 308 may be configured to absorb the heat generated by the respective integrated circuit to which the pad 308 is touching.

In some examples, as described previously with reference to FIG. 3A, the condenser plate 304 may include a plurality of cutouts or apertures that are configured to accommodate a respective pad of the plurality of pads 308. Additionally, each of the cutouts or apertures may include a top ledge 324A (as shown in FIG. 3F) and a bottom ledge 324B (as shown in FIG. 3F) along at least a portion of each cutout or aperture 380 to limit a distance that each pad of the plurality of pads 308 is able to move based in part on the directional force exerted by the plurality of sets of springs 316. The bottom plan view 303 may include a cross-sectional view 328 that is shown and described in greater detail with reference to FIG. 3E. In particular, the cross-sectional view 328 may depict the top ledge 324A and the bottom ledge 324B in greater detail.

FIG. 3E depicts the cross-sectional section view 328 of a bottom portion of the heat-pipe assembly 208 in accordance with embodiments of the present disclosure. As shown in the section view 328, each pad 308 (e.g., the third pad 308C and the fourth pad 308D, but not limited to those pads) may be restrained from moving too far in a direction based on the directional force exerted by the respective sets of springs described herein based on the top ledge 324A and the bottom ledge 324B. Also, each pad 308 may be restrained from moving too far in the lateral direction based on a peripheral wall 390 defined by the cutout or aperture 380 as discussed in greater detail below in FIGS. 3F and 3G. Moreover, the top and bottom ledges 324A, 324B are configured to limit a distance that each pad 308 is able to move with respect to the condenser plate 304.

FIG. 3F shows a top perspective view 332 of a condenser plate 304 in accordance with embodiments of the present disclosure. The condenser plate 304 includes a plurality of cutouts or apertures 380 that are configured to accommodate a respective pad of the plurality of pads 308. Additionally, each of the cutouts or apertures 380 may include a peripheral wall 390 and a top ledge 324A and a bottom ledge 324B along at least portions of the peripheral wall 390 of each cutout or aperture 380 to limit a distance that each pad of the plurality of pads 308 is able to move based in part on the directional force exerted by the plurality of sets of springs 316. According to embodiments of the present disclosure, the cutouts or apertures 380 are provided such that the pads 308 are allowed to move upwardly and downwardly within the cutouts or apertures 380 (being limited by the top ledge 324A and bottom ledge 324B).

FIG. 3G shows a top plan view 336 of the condenser plate 304 in accordance with embodiments of the present disclosure. As illustrated, the condenser plate 304 includes the plurality of cutouts or apertures 380 that are configured to accommodate a respective pad of the plurality of pads 308 and the peripheral wall 390. According to embodiments of the present disclosure as illustrated in FIG. 3F, the top ledge 324A and the bottom ledge 324B each extends interiorly of the peripheral wall 390. The peripheral wall 390 and each of the top and bottom ledges 324A, 324B is spaced from an adjacent surface of a pad in a corresponding cutout or aperture 380. Thus, the lateral movement of each pad 308 is constrained by the peripheral wall 390 in the corresponding cutout or aperture 380 and the upward and downward movement of each pad 308 is constrained by the top and bottom ledges 324A, 324B in the corresponding cutout or aperture 380.

Figure 4A:
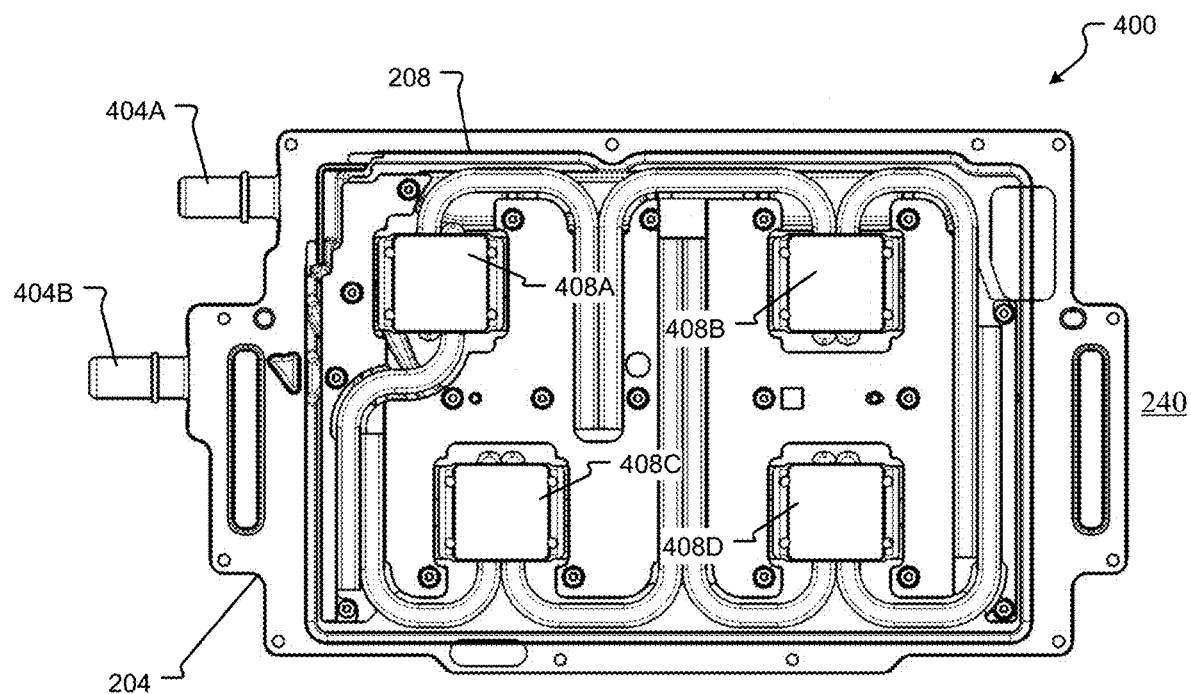
FIG. 4A shows a bottom plan view of a first subassembly of the electronic package in accordance with embodiments of the present disclosure.
Figure 4B:
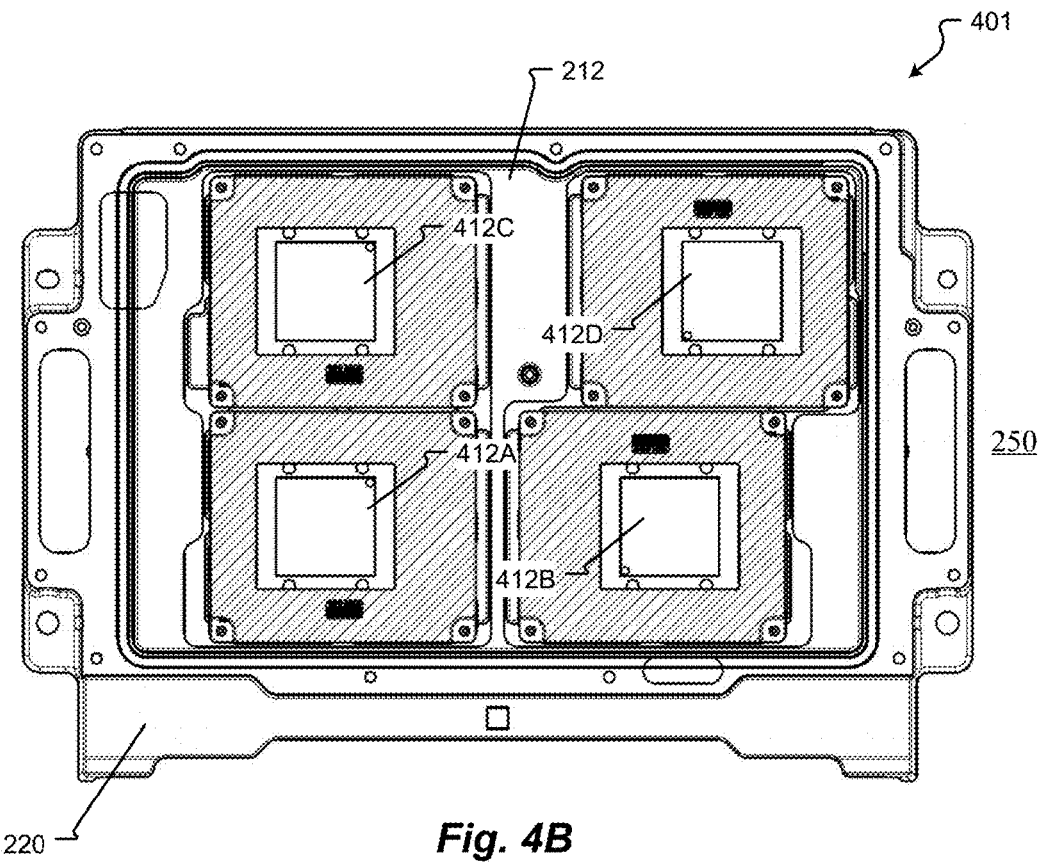
FIG. 4B shows a top plan view of a second subassembly of the electronic package in accordance with embodiments of the present disclosure.

FIG. 4A depicts a bottom view 400 of a first subassembly 240 of the electronic package 104 in accordance with embodiments of the present disclosure, and FIG. 4B depicts a top plan view 401 of a second subassembly 250 of the electronic package 104 in accordance with embodiments of the present disclosure. FIGS. 4A and 4B may implement aspects of or may be implemented by aspects of FIGS. 1, 2 and 3A-3G. For example, the bottom plan view 400 of the first subassembly 240 and the top plan view 401 of the second subassembly 250 may be views of respective subassemblies for the electronic package 104 as described with reference to FIGS. 1-3G.

The first subassembly 240 of the electronic package 104 as illustrated by the bottom plan view 400 may include the cooling system 204 and the heat-pipe assembly 208 as described with reference to FIG. 2. Additionally, as described with reference to FIG. 2, the cooling system 204 may include a first valve 404A and a second valve 404B (e.g., interchangeably an inlet and an outlet) that enable a flow of coolant liquid through a chamber of the cooling system 204. As can be seen in the example of FIG. 4A, the first subassembly 240 of the electronic package 104 may include bottom surfaces 408, which represent the bottoms of the plurality of pads 308 as described with reference to FIGS. 3A-3E.

The second subassembly 250 of the electronic package 104 as illustrated by the top plan view 401 may include the middle plate 212, the main PCB 216 (e.g., not shown), and the bottom cover 220. As shown and as described previously, the middle plate 212 may include multiple integrated circuits 412 that provide functions to the electronic package 104. In some examples, the multiple integrated circuits 412 may be referred to as SOCs, processors, etc.

In some examples, the bottom surfaces 408 (e.g., bottoms of the pads 308) may be positioned on the heat-pipe assembly 208 to correspond to locations of the multiple integrated circuits 412. For example, a position of a first bottom surface 408A may correspond to a first integrated circuit 412A of the middle-plate 212, a position of a second bottom surface 408B may correspond to a second integrated circuit 412B of the middle plate 212, a position of a third bottom surface 408C may correspond to a third integrated circuit 412C of the middle plate 212, and a position of a fourth bottom surface 408D may correspond to a fourth integrated circuit 412D of the middle plate 212.

As described herein and provided in the present disclosure, the heat-pipe assembly 208 may include a plurality of sets of springs 316 configured to exert a directional force on the plurality of pads 308 when the electronic package 104 is fully assembled, such that each of the plurality of pads 308 are individually moved to make the bottom surfaces 408 come into contact with a corresponding integrated circuit 412 of the electronic package 104.

Figure 5:
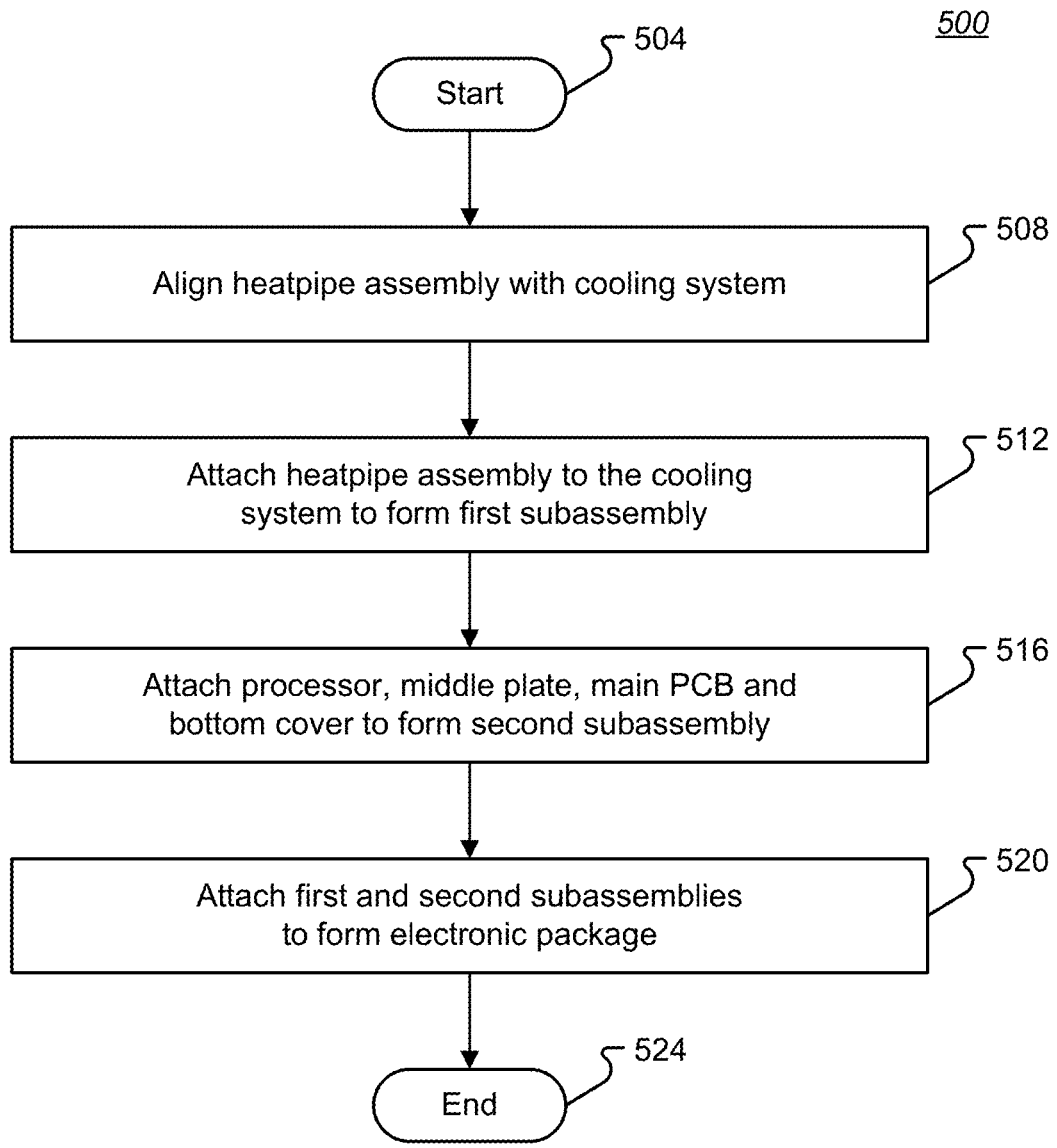
FIG. 5 is a flow diagram of a method for assembling an electronic package in accordance with embodiments of the present disclosure.

FIG. 5 depicts a flow diagram of a method 500 for assembling the electronic package 104 in accordance with embodiments of the present disclosure. For example, the method 500 may be used for forming and assembling the electronic package 104 as described with reference to FIG. 1 that at least includes a heat-pipe assembly 208 as described herein and with reference to FIGS. 2, 3A-3G, 4A and 4B. While a general order for the steps of the method 500 is shown in FIG. 5, the method 500 can include more or fewer steps or can arrange the order of the steps differently than those shown in FIG. 5. Generally, the method 500 starts with a START operation at step 504 and ends with an END operation at step 524. The method 500 can be executed as a set of computer-executable instructions executed by an assembly machine (e.g., robotic assembly system, automation assembly system, computer aided drafting (CAD) machine, etc.) and encoded or stored on a computer readable medium. Hereinafter, the method 500 shall be explained with reference to the components, devices, assemblies, environments, etc. described in conjunction with FIGS. 1-4B, 6A and 6B.

The method 500 may begin with the START operation at step 504 and proceeds to step 508 where the heat-pipe assembly 208 is aligned with the cooling system 204 based at least on one or more alignment pins. In some examples, a plurality of sets of springs 316 may be disposed on a top surface of the heat-pipe assembly 208 or on the bottom surface of the cooling system 204, such that the plurality of sets of springs 316 are in contact with the cooling system 204 to exert the directional force in a direction opposing the cooling system 204.

The method 500 may continue by attaching the heat-pipe assembly 208 to the cooling system 204 to form the first subassembly 240 (step 512). In some examples, attaching the heat-pipe assembly 208 may exert the directional force via the plurality of sets of springs 316 to move each of the plurality of pads 308 in the direction opposing the cooling system 204.

Additionally, the method 500 may include attaching the processor 412, the middle plate 212, the main PCB 216 and the bottom cover 220 to form the second subassembly 250. Attaching these components provides an electrical coupling between the main PCB 216 and the plurality of integrated circuits 412 of the middle plate 212 (e.g., the integrated circuits 412 as shown and described with reference to FIGS. 4A and 4B) (step 516).

The method 500 may further include attaching the first and second subassemblies 240, 250 to form the electronic package (step 520). In some cases, attaching the first subassembly 240 and the second subassembly 250 may result in each of the plurality of pads 308 of the heat-pipe assembly 208 coming into contact with the corresponding integrated circuit 412 of the middle plate 212 based on the plurality of sets of springs 316 exerting the directional force opposing the cooling system 204. Additionally, in some examples, attaching the bottom cover 220 to the cooling system 204 provides a hermetic seal for the main PCB 216 and the plurality of integrated circuits 412 of the middle plate 212. In some examples, thermal energy produced by the plurality of integrated circuits 412 may be transferred from the middle plate 212 to the cooling system 204 via the condenser plate 304 of the heat-pipe assembly 208, the plurality of pads 308, and the one or more heat-pipes 312 based on the plurality of sets of springs 316 as described herein. Method 500 ends with the END operation at step 524.

FIG. 6A shows a simplified cross-sectional view 600 of the electronic package 104 before the first and second subassemblies 240, 250 are attached in accordance with embodiments of the present disclosure. As shown in FIG. 6A, the first subassembly 240 which includes the cooling system 204 is attached to the heat-pipe assembly 208 which includes the condenser plate 304, the one or more heat-pipes 312, the pads 308C and 308D and springs 316. The cooling system 204 is attached to the heat-pipe assembly 208 by way of screws 260, for example. As illustrated in FIG. 6A, the pads 308C and 308D directly engaged the bottom surface of the cooling system 204 only through the springs 316 engaging the pads 308C and 308D. According to a further embodiment of the present disclosure, the springs 316 may include compression springs having substantially equivalent spring constants.

Provided between the bottom surface of the cooling system 204 and the top surface of the heat-pipe assembly 208 is a thermal interface material (TIM) or thermal grease 620 that may improve thermal conductivity between the heat-pipe assembly 208 and the cooling system 204. Moreover, a thermal grease 630 is also applied on a bottom surface of the heat-pipe assembly 208 or a top surface of the processors 412 to interface the pads 308 with processors 412 as discussed in greater detail below.

As shown in FIG. 6A, the second subassembly 250 includes the bottom cover 220 and the daughter cards 210 that include processors 412C and 412D, respectively. Although not illustrated, the second subassembly 250 further includes the middle plate 212 and the PCB 216, and the daughter cards 210 are attached and electrically coupled to the main PCB 216 via the middle plate 212, as described above. As shown, each pad 308 (e.g., the third pad 308C and the fourth pad 308D, but not limited to those pads) may be restrained from moving too far in a direction based on the directional force exerted by the respective sets of springs 316 described herein based on the top ledge 324A and the bottom ledge 324B. Moreover, each pad 308 may be restrained from moving in the lateral direction by the peripheral wall 390.

According to one embodiment of the present disclosure as illustrated in FIG. 6A, processor 412C has a height greater than a height of processor 412D. Moreover, due to manufacturing tolerances, the top surface of processor 412C is uneven as compared with the top surface of processor 412D which is even.

FIG. 6B shows another simplified cross-sectional view 650 of the electronic package 104 after the first and second subassemblies 240, 250 are attached in accordance with embodiments of the present disclosure. The first subassembly 240 may be attached to the second subassembly by screw 260, for example. As illustrated in FIG. 6B, the springs 316 between the cooling system 204 and the pad 308C collectively exert a first compressive force on processor 412C and the springs 316 between the cooling system 204 and the pad 308D collectively exert a second compressive force on processor 412D different than the first compressive force. The first compressive force and the second compressive force are proportional to first and second distances of processors 412C and 412D, respectively, from the opposing surface of the cooling system 204. The differences in compressive forces are due to the height variations in the processors 412C and 412D.

According to another embodiment of the present disclosure with reference to processor 412C illustrated in FIG. 6B, each spring 316 engaging pad 308C exerts a different compressive force on an opposing surface of processor 412C since the plane of the opposing surface of processor 412C is transverse to a plane of the opposing surface of the cooling system 204.

According to a further embodiment of the present disclosure, the one or more heat-pipes 312 are elastically flexible to enable movement in response to movement of a corresponding pad 308 and a thermal resistance between each of pads 308C and 308D and processors 412C and 412D, respectively. According to an alternative embodiment of the present disclosure, when the heights of each of processors 412C and 412D is substantially the same and the springs 316 are compression springs having substantially equivalent spring constants, a first distance between opposing surfaces of pad 308C and processor 412C is substantially equal to a second distance between opposing surfaces of pad 308D and 412D, the first and second distances are substantially constant over an area of a corresponding pair of opposing surfaces and the first and second distances are substantially constant over an area of a corresponding pair of opposing surfaces.

According to a further embodiment of the present disclosure as illustrated in FIG. 6B, each of the springs 316 is configured to cause of portion of pad 308C and/or 308D to maintain a constant compressive force on the opposing surface of processor 412C and/or 412D, respectively, to maintain a substantially uniform rate of heat transfer between opposing surfaces of pad 308C and/or 308D and 412C and/or 412D, respectively.

The exemplary systems and methods of this disclosure have been described in relation to electronic packaging and the thermal control of sealed electronics. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others. In some embodiments, the present disclosure provides an electrical interconnection device that can be used between any electrical source and destination.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein, and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. When each one of A, B, and C in the above expressions refers to an element, such as X, Y, and Z, or class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The terms "determine," "calculate," "compute," and variations thereof, as used herein, are used interchangeably and include any type of methodology, process, mathematical operation or technique.

What is claimed is:

1. An assembly for providing cooling to a plurality of integrated circuits, comprising:
   a condenser plate including a plurality of apertures, each of the plurality of apertures overlapping a location of a corresponding one of the plurality of integrated circuits, wherein the condenser plate is a single contiguous plate;
   a plurality of pads, each of the plurality of pads being disposed within each of the plurality of apertures of the condenser plate, each of the plurality of pads being configured to move in a vertical direction;
   one or more heat-pipes attached to the condenser plate and the plurality of pads, the one or more heat-pipes configured to move in the vertical direction, wherein the one or more heat-pipes are elastic, and wherein each of the plurality of pads is configured to be in thermal connection with the corresponding one of the plurality of integrated circuits by a movement of the one or more heat-pipes in the vertical direction to transfer to the condenser plate thermal energy received by each of the plurality of pads from the plurality of integrated circuits; and
   a plurality of biasing members engaging each pad of the plurality of pads and an opposing surface of a heat removal component in thermal connection with the condenser plate, each of the plurality of biasing members being configured to apply a compressive force to a portion of a corresponding one of the plurality of pads and the opposing surface of the heat removal component in response to movement of the portion of the corresponding one of the plurality of pads,
   wherein the heat removal component is either a heatsink or a cold-plate.

2. The assembly according to claim 1, wherein a first plurality of biasing members on a first pad collectively exerts a first compressive force on a corresponding first integrated circuit and a second plurality of biasing members on a second pad collectively exerts a second compressive force on a corresponding second integrated circuit different than the first compressive force.

3. The assembly according to claim 1, wherein each of the plurality of apertures comprises a peripheral wall and a ledge extending interiorly of the peripheral wall, the peripheral wall and ledge being spaced from an adjacent surface of a pad in a corresponding aperture, wherein a lateral movement of each pad of the plurality of pads is constrained by the peripheral wall in the corresponding aperture, and wherein the downward movement of each pad of the plurality of pads is constrained by the ledge in the corresponding aperture.

4. The assembly according to claim 1, wherein each of the plurality of pads directly engages the opposing surface of the heat removal component only through the plurality of biasing members engaging the corresponding one of the plurality of pads.

5. The assembly according to claim 1, wherein the plurality of biasing members comprises a plurality of compressive springs, the plurality of compressive springs having substantially equivalent spring constants.

6. The assembly according to claim 1, wherein each of the plurality of biasing members is configured to cause the portion of the corresponding one of the plurality of pads to maintain a constant compressive force on an opposing surface of the corresponding one of the plurality of integrated circuits to maintain a substantially uniform rate of heat transfer between opposing surfaces of the corresponding one of the plurality of pads and the corresponding one of the plurality of integrated circuits.

7. An assembly for providing cooling to a plurality of integrated circuits, comprising:
   a condenser plate including a plurality of apertures, each of the plurality of apertures overlapping a location of a corresponding one of the plurality of integrated circuits, wherein the condenser plate is a single contiguous plate;
   one or more heat-pipes attached to the condenser plate and provided over the plurality of apertures overlapping the location of the corresponding one of the plurality of integrated circuits, wherein the one or more heat-pipes are elastic, and wherein the one or more heat-pipes are configured to move in a vertical direction to transfer to the condenser plate thermal energy from the plurality of integrated circuits;
   a plurality of pads, wherein each of the plurality of pads is disposed within each of the plurality of apertures of the condenser plate and configured to move in the vertical direction, wherein the one or more heat-pipes are also attached to the plurality of pads, and wherein each of the plurality of pads is configured to be in thermal connection with the corresponding one of the plurality of integrated circuits by the movement of the one or more heat-pipes in the vertical direction; and
   a plurality of biasing members engaging each pad of the plurality of pads and an opposing surface of a heat removal component in thermal connection with the condenser plate, each of the plurality of biasing members being configured to apply a compressive force to a portion of a corresponding one of the plurality of pads and the opposing surface of the heat removal component in response to movement of the portion of the corresponding one of the plurality of pads,
   wherein the heat removal component is either a heatsink or a cold-plate.

8. The assembly according to claim 7, wherein a first plurality of biasing members on a first pad collectively exerts a first compressive force on a corresponding first integrated circuit and a second plurality of biasing members on a second pad collectively exerts a second compressive force on a corresponding second integrated circuit different than the first compressive force.

9. The assembly according to claim 7, wherein each of the plurality of apertures comprises a peripheral wall and a ledge extending interiorly of the peripheral wall, the peripheral wall and ledge being spaced from an adjacent surface of a pad in a corresponding aperture, wherein a lateral movement of each pad of the plurality of pads is constrained by the peripheral wall in the corresponding aperture, and wherein the downward movement of each pad of the plurality of pads is constrained by the ledge in the corresponding aperture.

10. The assembly according to claim 7, wherein each of the plurality of pads directly engages the opposing surface of the heat removal component only through the plurality of biasing members engaging the corresponding one of the plurality of pads.

11. The assembly according to claim 7, wherein the plurality of biasing members comprises a plurality of compressive springs, the plurality of compressive springs having substantially equivalent spring constants.

12. The assembly according to claim 7, wherein each of the plurality of biasing members is configured to cause the portion of the corresponding one of the plurality of pads to maintain a constant compressive force on an opposing surface of the corresponding one of the plurality of integrated circuits to maintain a substantially uniform rate of heat transfer between opposing surfaces of the corresponding one of the plurality of pads and the corresponding one of the plurality of integrated circuits.

13. An electronic package, comprising:
a heat removal component that provides a top cover surface for the electronic package;
a bottom cover including a printed circuit board and a plurality of integrated circuits attached on the printed circuit board;
a condenser plate sandwiched between the heat removal component and the bottom cover, the condenser plate including a plurality of apertures, each of the plurality of apertures overlapping a location of a corresponding one of the plurality of integrated circuits,
wherein the condenser plate is a single contiguous plate;
a plurality of pads, each of the plurality of pads being disposed within each of the plurality of apertures of the condenser plate, wherein each of the plurality of pads is configured to move in a vertical direction;
one or more heat-pipes attached to the condenser plate and the plurality of pads, the one or more heat-pipes being configured to move in the vertical direction,
wherein the one or more heat-pipes are elastic,
wherein each of the plurality of pads is configured to be in thermal connection with the corresponding one of the plurality of integrated circuits by a movement of the one or more heat-pipes in the vertical direction to transfer to the condenser plate thermal energy received by each of the plurality of pads from the plurality of integrated circuits, and
wherein the heat removal component, the condenser plate and the bottom cover are rigidly connected to each other; and
a plurality of biasing members engaging each pad of the plurality of pads and an opposing surface of the heat removal component in thermal connection with the condenser plate, each of the plurality of biasing members being configured to apply a compressive force to a portion of a corresponding one of the plurality of pads and the opposing surface of the heat removal component in response to movement of the portion of the corresponding one of the plurality of pads,
wherein the heat removal component is either a heatsink or a cold-plate.

14. The electronic package according to claim 13, wherein each of the plurality of apertures comprises a peripheral wall and a ledge extending interiorly of the peripheral wall, the peripheral wall and ledge being spaced from an adjacent surface of a pad in a corresponding aperture, wherein a movement of each pad of the plurality of pads is constrained by the peripheral wall in the corresponding aperture, and wherein the downward movement of each pad of the plurality of pads is constrained by the ledge in the corresponding aperture.

15. The electronic package according to claim 13, wherein each of the plurality of pads directly engages the opposing surface of the heat removal component only through the plurality of biasing members engaging the corresponding one of the plurality of pads.

\* \* \* \* \*